(12) United States Patent
Tanaka

(10) Patent No.: US 8,551,818 B2
(45) Date of Patent: Oct. 8, 2013

(54) METHOD OF MANUFACTURING ELECTRONIC DEVICE AND DISPLAY

(75) Inventor: Masanobu Tanaka, Kanagawa (JP)

(73) Assignee: Sony Corporation, Tokyo (JP)

( * ) Notice: Subject to any disclaimer, the term of this patent is extended or adjusted under 35 U.S.C. 154(b) by 277 days.

(21) Appl. No.: 12/656,471

(22) Filed: Feb. 1, 2010

(65) Prior Publication Data

US 2010/0237380 A1    Sep. 23, 2010

(30) Foreign Application Priority Data

Mar. 19, 2009  (JP) ................................. 2009-068774

(51) Int. Cl.
 *H01L 21/00* (2006.01)
(52) U.S. Cl.
 USPC ........... 438/118; 438/455; 438/620; 438/621; 438/774; 438/323; 438/434; 438/680; 438/681
(58) Field of Classification Search
 USPC ......... 438/455, 620, 621, 774, 323, 434, 680, 438/681, 118
 See application file for complete search history.

(56) References Cited

U.S. PATENT DOCUMENTS

| | | | | |
|---|---|---|---|---|
| 5,362,671 A | * | 11/1994 | Zavracky et al. | 438/29 |
| 2002/0030189 A1 | * | 3/2002 | Ishikawa | 257/59 |
| 2003/0222334 A1 | * | 12/2003 | Ikeda et al. | 257/678 |
| 2004/0164302 A1 | * | 8/2004 | Arai et al. | 257/72 |
| 2004/0201789 A1 | * | 10/2004 | Akiyama | 349/43 |
| 2006/0240643 A1 | * | 10/2006 | Franosch et al. | 438/455 |
| 2008/0315391 A1 | * | 12/2008 | Kohl et al. | 257/690 |
| 2009/0104784 A1 | * | 4/2009 | Sakashita | 438/758 |

FOREIGN PATENT DOCUMENTS

| | | |
|---|---|---|
| JP | 3447619 | 7/2003 |
| JP | 3809710 | 6/2006 |
| JP | 2006-245067 | 9/2006 |
| WO | WO-2007/148448 A1 | 12/2007 |

OTHER PUBLICATIONS

Japanese Office Action issued Feb. 16, 2011 for corresponding Japanese Application No. 2009-068774.

* cited by examiner

*Primary Examiner* — Chuong A Luu
*Assistant Examiner* — Hajar Kolahdouzan
(74) *Attorney, Agent, or Firm* — Rader, Fishman & Grauer PLLC

(57) ABSTRACT

A method of manufacturing an electronic device includes the steps of: forming a sacrifice layer made of at least one of an alkali metal oxide and an alkali earth metal oxide in a part of a first substrate; forming a supporting layer covering the sacrifice layer; forming an electronic device on the sacrifice layer with the supporting layer in between; exposing at least a part of a side face of the sacrifice layer by removing a part of the supporting layer; forming a support body between the electronic device and the supporting layer, and a surface of the first substrate; removing the sacrifice layer; breaking the support body and transferring the electronic device onto a second substrate by bringing the electronic device into close contact with an adhesion layer provided on a surface of the second substrate; removing a fragment of the support body belonging to the electronic device; removing at least an exposed region in the adhesion layer not covered with the electronic device; and forming a fixing layer on a surface of the electronic device and the surface of the second substrate.

23 Claims, 23 Drawing Sheets

FIG. 16A
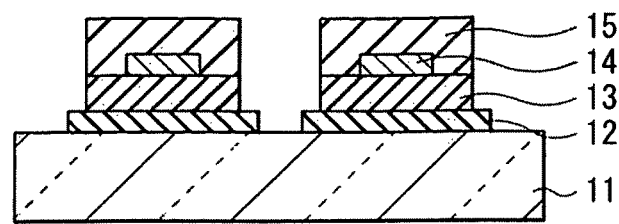
FIG. 16B
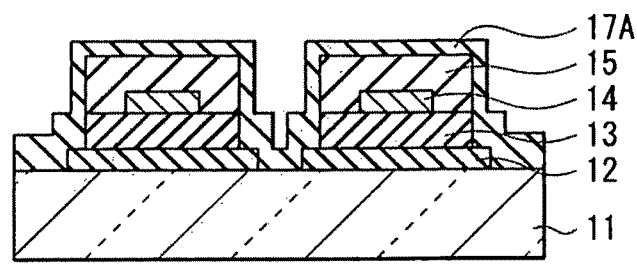
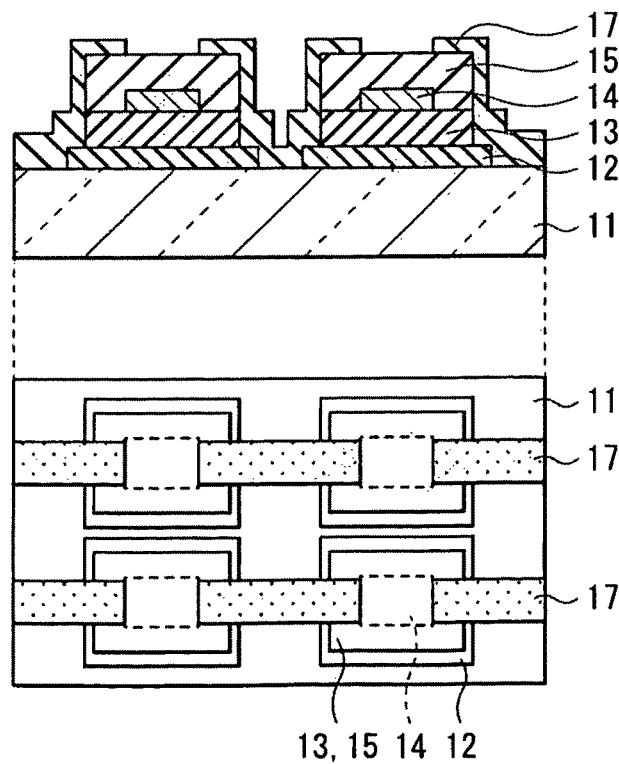
FIG. 17

METHOD OF MANUFACTURING ELECTRONIC DEVICE AND DISPLAY

BACKGROUND OF THE INVENTION

1. Field of the Invention

The present invention relates to a method of manufacturing an electronic device using transfer technique, and a display including the transferred electronic device.

2. Description of the Related Art

In recent years, development of a field called printable electronics has been remarkable. For the purpose of this development, the cost of expensive electronic components which have been manufactured through the full use of semiconductor manufacturing technique is reduced by manufacturing the electronic components through the use of printing method and nano-imprinting method, a flexible device is provided by replacing a substrate with a film, and the like. Thus, materials such as an organic semiconductor and nano-metal ink, and printing technique have been actively developed. The cost reduction and the low temperature of the process have been achieved, however, there is an issue of a trade-off that reliability and performance are sacrificed.

Meanwhile, an active matrix substrate using the transfer technique has been manufactured since the late 1990's. For example, in Japanese Patent No. 3447619, it is disclosed that a TFT (thin film transistor) element is formed after forming an etching stopper layer on a glass substrate, and the glass substrate is completely etched and removed under the condition that the TFT element is covered with an interconnection substrate to be protected from etching liquid for the glass substrate. The final product is manufactured by selectively transferring from the interconnection substrate onto another substrate.

In Japanese Patent No. 3809710, a hydrogenated amorphous silicon layer or the like is formed on a glass substrate, and a TFT element is formed on the hydrogenated amorphous silicon layer or the like. The TFT element is fixed onto a substrate to be transferred with an adhesive, and laser light is irradiated to the TFT element from the rear surface for heating. With an increase of the pressure of separated hydrogen, the TFT element is peeled off from the glass substrate.

SUMMARY OF THE INVENTION

However, in these existing methods, in a step after the transfer, there is an issue that the position accuracy of the transferred TFT element is deteriorated due to thermal deformation of resin composing an adhesion layer.

In view of the foregoing, it is desirable to provide a method of manufacturing an electronic device capable of suppressing deterioration of position accuracy of the transferred electronic device, and a display.

According to an embodiment of the present invention, there is provided a method of manufacturing an electronic device including the steps (A) to (J) below:
(A) forming a sacrifice layer made of at least one of an alkali metal oxide and an alkali earth metal oxide in a part of a first substrate;
(B) forming a supporting layer covering the sacrifice layer;
(C) forming an electronic device on the sacrifice layer with the supporting layer in between;
(D) exposing at least a part of a side face of the sacrifice layer by removing a part of the supporting layer;
(E) forming a support body between the electronic device and the supporting layer, and a surface of the first substrate;
(F) removing the sacrifice layer;
(G) breaking the support body and transferring the electronic device onto a second substrate by bringing the electronic device into close contact with an adhesion layer provided on a surface of the second substrate;
(H) removing a fragment of the support body belonging to the electronic device;
(I) removing at least an exposed region in the adhesion layer not covered with the electronic device; and
(J) forming a fixing layer on a surface of the electronic device and the surface of the second substrate.

According to an embodiment of the present invention, there is provided a display including components (A) to (F) below:
(A) a second substrate;
(B) an electronic device arranged on the second substrate;
(C) a supporting layer formed on a top face or a bottom face of the electronic device;
(D) a fixing layer formed on a surface of the electronic device, and a surface of the second substrate;
(E) a wiring connected to the electronic device through a contact hole provided in the fixing layer, or a contact hole provided in the fixing layer and the supporting layer; and
(F) a display element formed on the electronic device and the wiring with an interlayer insulating film in between.

In the display according to the embodiment of the present invention, the electronic device is arranged on the second substrate, and the fixing layer is formed on the surface of the electronic device and the surface of the second substrate. Thereby, the electronic device is fixed directly onto the second substrate by the fixing layer, and it is possible to suppress deterioration of position accuracy.

According to the method of manufacturing the electronic device of the embodiment of the present invention, after transferring the electronic device onto the second substrate, the fragment of the support body belonging to the electronic device is removed, at least the exposed region in the adhesion layer not covered with the electronic device is removed, and the fixing layer is formed on the surface of the electronic device and the surface of the second substrate. Thereby, it is possible to suppress the deterioration of the position accuracy of the transferred electronic device.

According to the display of the embodiment of the present invention, the electronic device is arranged on the second substrate, and the fixing layer is formed on the surface of the electronic device and the surface of the second substrate. Thereby, it is possible to suppress the deterioration of the position accuracy of the transferred electronic device.

Other and further objects, features and advantages of the present invention will appear more fully from the following description.

BRIEF DESCRIPTION OF THE DRAWINGS

FIGS. 16A and 16B are cross sectional views illustrating the manufacturing method illustrated in FIG. 15 in a step order.

FIG. 17 is a cross sectional view and a plan view illustrating a step subsequent to FIGS. 16A and 16B.

DETAILED DESCRIPTION OF THE PREFERRED EMBODIMENTS

Embodiments of the present invention will be hereinafter described in detail with reference to the drawings. The description will be made in the following order:
1. First embodiment (example where an adhesion layer is wholly removed)
2. Second embodiment (example where only an exposed region of the adhesion layer is removed)
3. Third embodiment (example where a supporting layer and a support body are formed as separate layers)
4. First application example (electronic device)
5. Second application example (electronic device group)
6. Third application example (display)
7. First modification (example of an additional fixing method)

1. First Embodiment

Figure 1:
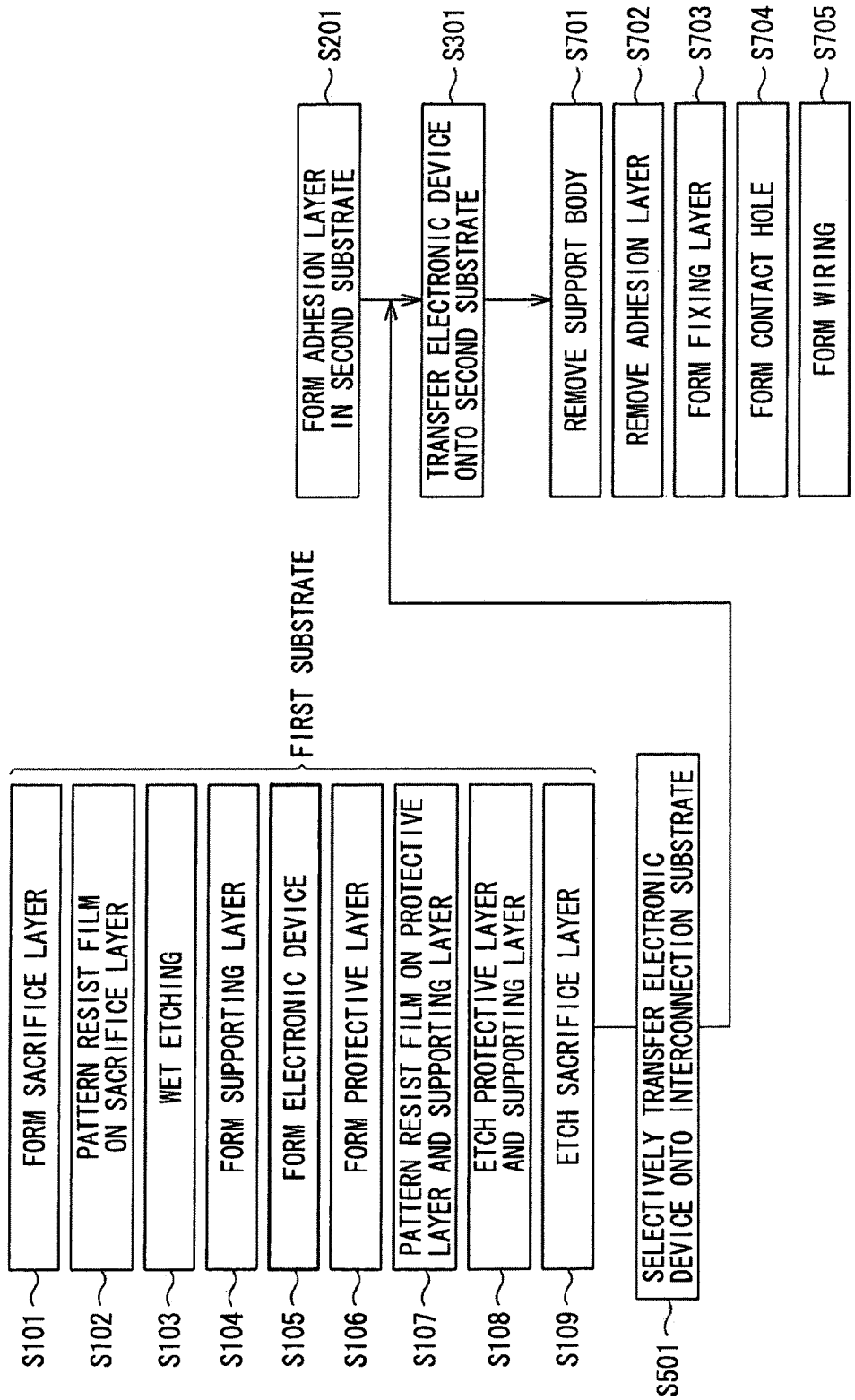
FIG. 1 is a flow chart illustrating a flow of a method of manufacturing an electronic device according to a first embodiment of the present invention.
Figure 2A:
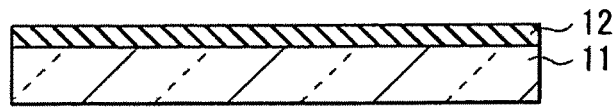
FIGS. 2A to 2E are cross sectional views illustrating the manufacturing method illustrated in FIG. 1 in a step order.

FIG. 1 illustrates a schematic flow of a method of manufacturing an electronic device according to a first embodiment of the present invention. FIGS. 2A to 2E, 3, 4, 5, 6A to 6D, 7, 8, 9, 10A to 10C, and 11A to 11C illustrate this manufacturing method in a step order. First, as illustrated in FIG. 2A, a sacrifice layer 12 made of at least one of alkali metal oxide and alkali earth metal oxide is formed on a first substrate 11 (Step S101).

The first substrate 11 has, for example, a thickness of 0.3 mm to 5.0 mm both inclusive, and is desirably made of a material suitable for forming the electronic device, such as glass, synthetic quartz, sapphire, silicon, and ceramics.

The sacrifice layer 12 has, for example, a thickness of 10 nm to 100000 nm both inclusive, and is composed of, for example, alkali metal oxide, alkali metal carbonate, alkali metal sulfate or alkali metal hydroxide, or alkali earth metal oxide, alkali earth metal carbonate, alkali earth metal sulfate or alkali earth metal hydroxide. In this manner, by using at least one of the alkali metal oxide and the alkali earth metal oxide as the sacrifice layer 12, a high-speed etching is possible, and a high-temperature process at 300° C. or more is allowable. Therefore, by utilizing a typical semiconductor manufacturing technique including various deposition methods such as vacuum evaporation, sputtering and CVD, and photolithography, it is possible to form the electronic device having high performance and high reliability similar to those of the electronic device of the existing art.

Specifically, examples of the alkali metal oxide, the alkali metal carbonate, the alkali metal sulfate, or the alkali metal hydroxide include lithium oxide ($Li_2O$), lithium carbonate ($Li_2CO_3$), sodium carbonate (soda) ($Na_2CO_3$), sodium percarbonate ($Na_2CO_4$), sodium dithionite ($Na_2S2O_4$), sodium sulfite ($Na_2SO_3$), sodium hydrogen sulfite ($NaHSO_3$), sodium sulfate (salt cake) ($Na_2SO_4$), sodium thiosulfate (hypo) ($Na_2S_2O_3$), sodium nitrite ($NaNO_2$), sodium nitrate ($NaNO_3$), potassium nitrate ($KNO_3$), potassium nitrite ($KNO_2$), potassium sulfite ($K_2SO_3$), potassium sulfate ($K_2SO_4$), potassium carbonate ($K_2CO_3$), potassium hydrogen carbonate ($KHCO_3$), and potassium percarbonate ($K_2CO_4$).

Examples of the alkali earth metal oxide, the alkali earth metal carbonate, the alkali earth metal sulfate, or the alkali earth metal hydroxide include beryllium oxide (BeO), magnesium sulfate ($MgSO_4$), magnesium oxide (MgO), magnesium carbonate ($MgCO_3$), calcium sulfate ($CaSO_4$), calcium carbonate ($CaCO_3$), calcium oxide (CaO), calcium hydroxide ($Ca(OH)_2$), strontium oxide (SrO), strontium titanate ($SrTiO_3$), strontium chromate ($SrCrO_4$), strontianite ($SrCO_3$; strontium carbonate), celestite ($SrSO_4$; strontium sulfate), strontium nitrate ($Sr(NO_3)_2$), barium peroxide ($BaO_2$), barium oxide (BaO), barium hydroxide ($Ba(OH)_2$), barium titanate ($BaTiO_3$), barium sulfate ($BaSO_4$), barium carbonate ($BaCO_3$), barium acetate ($Ba(CH_3COO)_2$), and barium chromate ($BaCrO_4$).

Figure 2B:

Next, as illustrated in FIG. 2B, a resist film not illustrated in the figure is formed on the sacrifice layer 12, and the resist film is patterned into a predetermined shape through the use of photolithography (step S102). Then, through the use of etching using the resist film as a mask, a part of the sacrifice layer 12 is removed to pattern the sacrifice layer 12 into a predetermined shape (step S103). Thereby, the sacrifice layer is formed on a part of the first substrate 11 (region where the electronic device will be formed).

Figure 2C:
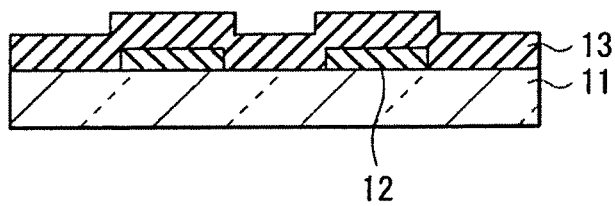

Next, as illustrated in FIG. 2C, a supporting layer 13 is formed on the whole surface of the first substrate 11 (step S104). In the supporting layer 13, a portion formed on the top face of the sacrifice layer 12 has rigidity and a thickness sufficient to be undeformable against the stress distribution within layers of an electronic device 14 which will be described later. Meanwhile, a portion formed on the side face of the sacrifice layer 12 is desirably easily-breakable in a transfer step which will be described later. The supporting layer 13 also serves as a protective film so that the electronic device is not damaged at the time of etching the sacrifice layer 12 which will be described later, and is preferably composed of a material insoluble in a solution for etching the sacrifice layer 12 of the above-described material, or a material having an etching rate of approximately $\frac{1}{5}$ or less. In addition, it is not necessary that the supporting layer 13 is formed on the whole surface of the first substrate 11, but it is enough if the supporting layer 13 covers at least the sacrifice layer 12.

Such a supporting layer 13 has, for example, a thickness of 10 nm to 100000 nm both inclusive, and is composed of oxide, nitride, metal, or resin. Examples of the oxide include $SiO_2$, $Al_2O_3$, ZnO, NiO, $SnO_2$, $TiO_2$, $VO_2$, and $In_2O_3$. Examples of the nitride include SiNx, GaN, InN, TiN, BN, MN, and ZrN. Examples of the metal include Au, Ag, Pt, Cu, Cr, Ni, Al, Fe, and Ta. Other examples of the metal include an Al—Nd alloy to which impurities are added, and AlSi. Examples of the resin include acrylic resin, epoxy resin, and polyimide resin.

Figure 2D:
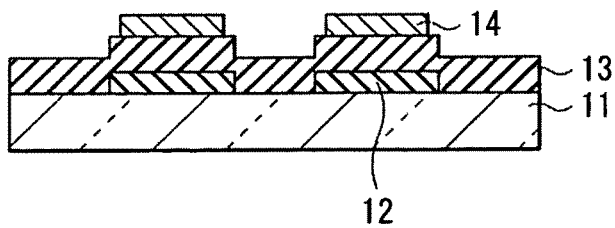

After that, as illustrated in FIG. 2D, the electronic device 14 is formed on the sacrifice layer 12 with the supporting layer 13 in between (step S105). Thereby, it is possible to eliminate the risk that the electronic device 14 is damaged by etching at the time of removing the sacrifice layer 12. Although the illustration of the detailed configuration is omitted in FIGS. 2A to 2E, 3, and 4, the electronic device 14 may be a TFT, a capacitor, a resistor, a wiring, a transparent electrode, an EL (electroluminescence) element, a color filter, an optical element, or the like, as long as it is an electronic device having desired functions.

Figure 2E:
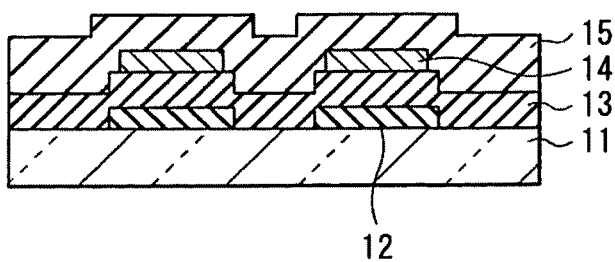

After forming the electronic device 14, as illustrated in FIG. 2E, a protective layer 15 is formed on the electronic device 14 (step S106). The protective layer 15 has, for example, a thickness of 10 nm to 100000 nm both inclusive, and is composed of oxide, nitride, or resin. Examples of the oxide include $SiO_2$, $Al_2O_3$, ZnO, NiO, $SnO_2$, $TiO_2$, $VO_2$, and $In_2O_3$. Examples of the nitride include SiNx, GaN, InN, TiN, BN, AlN, and ZrN. Examples of the resin include acrylic resin, epoxy resin, and polyimide resin.

Figure 3:
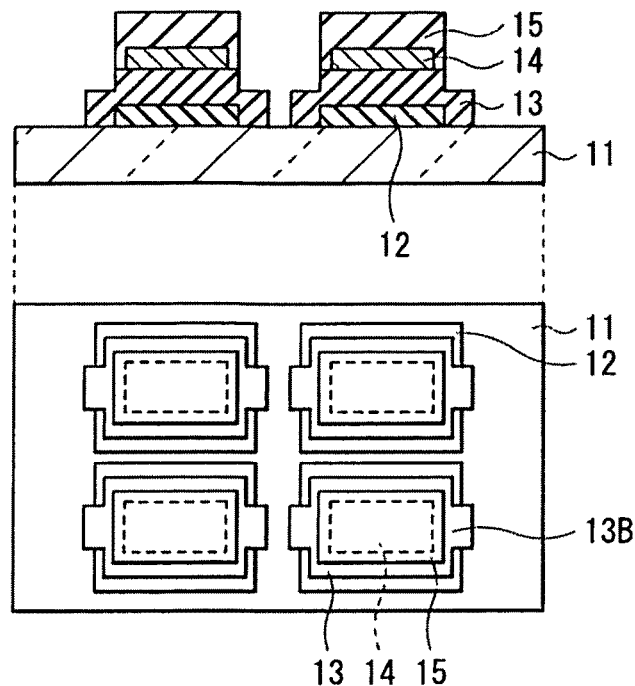
FIG. 3 is a cross sectional view and a plan view illustrating a step subsequent to FIGS. 2A to 2E.

After forming the protective layer 15, a resist film not illustrated in the figure is formed on the protective layer 15, and the resist film is patterned into a predetermined shape through the use of photolithography (step S107). As illustrated in FIG. 3, a part of the protective layer 15 and a part the supporting layer 13 are removed to expose at least a part of the side face of the sacrifice layer 12 through the use of dry etching or wet etching by using the resist film as a mask (step S108). At this time, a part of the supporting layer 13 is left on the side face of the sacrifice layer 12, and thereby a support body 13B which will be described later is formed.

Figure 4:
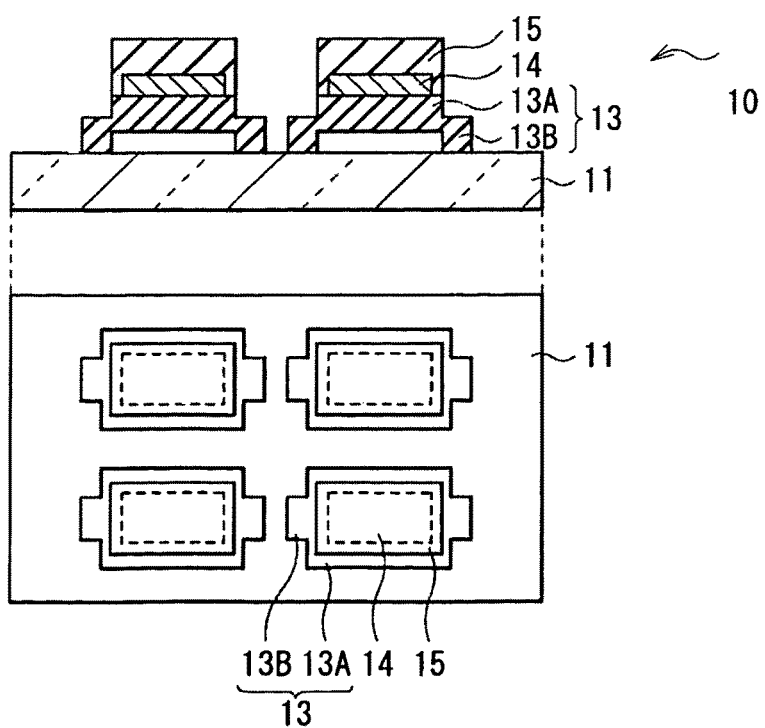
FIG. 4 is a cross sectional view and a plan view illustrating a step subsequent to FIG. 3.

After exposing the part of the sacrifice layer 12, as illustrated in FIG. 4, the sacrifice layer 12 is removed through the use of etching (step S109). Thereby, a transfer electronic device substrate 10 is formed.

In the transfer electronic device substrate 10, the supporting layer 13 includes the support body 13B on both sides of a body 13A. On the top face of the body 13A, the electronic device 14 is formed. Between the body 13A and the surface of the first substrate 11, there is a gap formed by removing the sacrifice layer 12, and the body 13A and the electronic device 14 on the body 13A are held floating in the air by the support body 13B.

Figure 5:
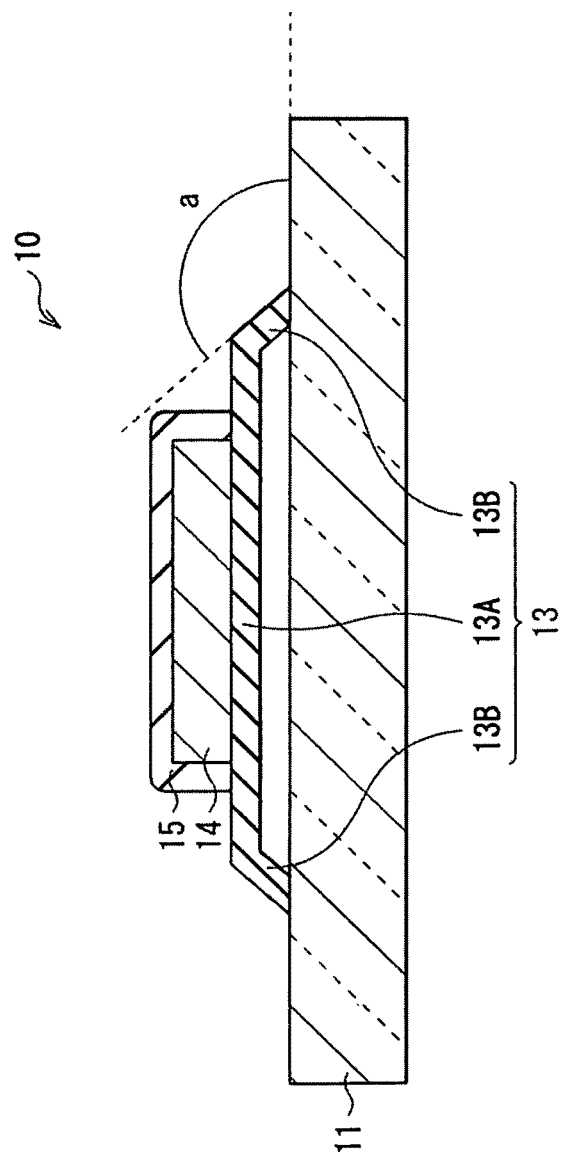
FIG. 5 is a cross sectional view for explaining the configuration of a support body.

The shape conditions of the supporting layer 13 for easily transferring the electronic device 14 are as follows. As illustrated in FIG. 5, the electronic device 14 is floated in the air above the first substrate 11 by being supported by the support body 13B. At this time, the support body 13B is preferably formed with an inclination "a" of approximately 90° to 150° both inclusive to the electronic device 14. Thereby, in comparison with the case where the support body 13B is horizontal or nearly horizontal, stress is concentrated on a bent section of the support body 13B at the time of transferring the electronic device 14, and it is possible to preferentially break the bent section.

The ratio of the width of the support body 13B to the width of the electronic device 14 is desirably 1:1 or less. In this case, by arranging the electronic devices 14 at a higher density, it is possible to obtain the high effect in terms of the productivity.

Moreover, as the transfer conditions, it is desirable to establish formula 1, where an adhesion stress between the electronic device 14 and a second substrate 21 is σ (D2), an adhesion area is A (D2), a break stress of the material of the support body 13B is σ (sus), the width of the support body 13B is "w" (sus), the thickness of the support body 13B is "t" (sus), and the number of the support bodies 13B for one electronic device 14 is "n".

$$\sigma(D2) \times A(D2) > \sigma(sus) \times w(sus) \times t(sus) \times n \qquad \text{Formula 1}$$

Figure 6A:
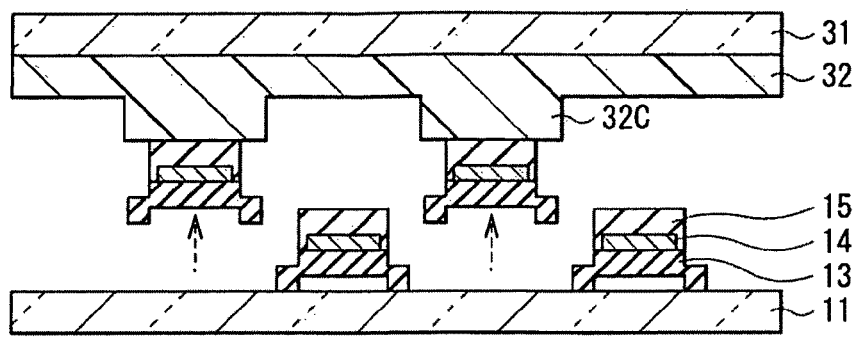
FIGS. 6A to 6D are cross sectional views illustrating a step subsequent to FIG. 4.

After removing the sacrifice layer 12, as illustrated in FIG. 6A, an interconnection substrate 31 made of glass or a resin film is prepared, and an adhesion layer 32 including a convex section 32C is formed on the surface of the interconnection substrate 31. The adhesion layer 32 may be formed by depositing silicone rubber (for example, PDMS), or may be formed by depositing an adhesive whose adhesion strength is lowered by ultraviolet irradiation.

The convex section 32C may be formed through the use of replica method, or may be formed through the use of direct processing method. In the replica method, a concavo-convex which is inverted from a desired shape is formed on a glass substrate or the like having a high flatness by using photoresist. Silicone rubber such as PDMS is poured into the concavo-convex and thermally cured, and then transferred onto the interconnection substrate 31. In the direct processing method, silicone rubber such as PDMS is applied in a desired thickness onto the interconnection substrate 31, and thermally cured. Then, through the use of oxygen plasma, the surface is oxidized and hydrophilized, and photoresist is applied onto the surface to form a desired pattern. Through the use of dry etching by using this resist as a mask, unnecessary silicone rubber is removed.

After that, the convex section 32C in the adhesion layer 32 of the interconnection substrate 31 is brought into close contact with the electronic device 14 on the first substrate 11, and the first substrate 11 is separated. As illustrated in FIG. 6A, only the electronic device 14 in contact with the convex section 32C is selectively transferred onto the interconnection substrate 31 (step S501).

Figure 6B:
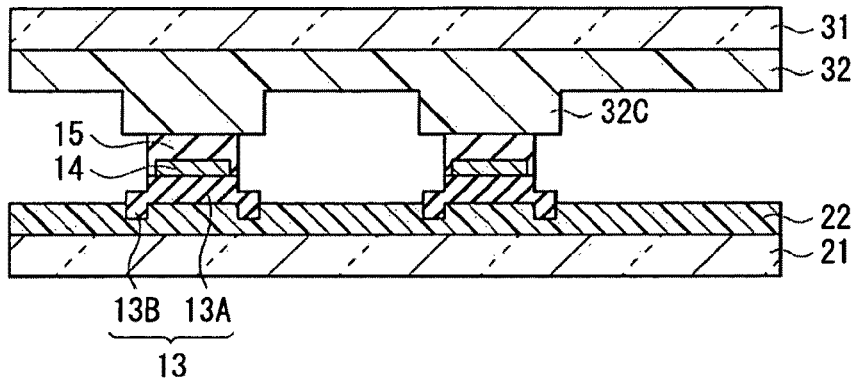

After selectively transferring the electronic device 14 onto the interconnection substrate 31, as illustrated in FIG. 6B, the second substrate 21 is prepared, and an adhesion layer 22 is formed on the surface of the second substrate 21 (step S201). The second substrate 21 may be variously selected from silicon (Si), synthetic quartz, glass, metal, a resin film, paper, and the like. This is because the transfer step is mainly a mechanical step, and is not restricted by heat and light.

The adhesion layer 22 is intended to improve adhesion between the second substrate 21 and the electronic device 14. For example, the adhesion layer 22 is formed by applying ultraviolet curable resin or thermoset resin onto the surface of the second substrate 21. The adhesion layer 22 may be formed by depositing elastic resin such as silicone rubber, butadiene rubber, or ABS resin. In this case, in all of the resins, Young's modules of the material is desirably 10 GPa or less. The thickness of the adhesion layer 22 is, for example, preferably larger than the height of the support body 13B. Specifically, the thickness of the adhesion layer 22 is preferably 50 nm to 2 μm both inclusive. The adhesion layer 22 is used in an uncured state.

Figure 6C:
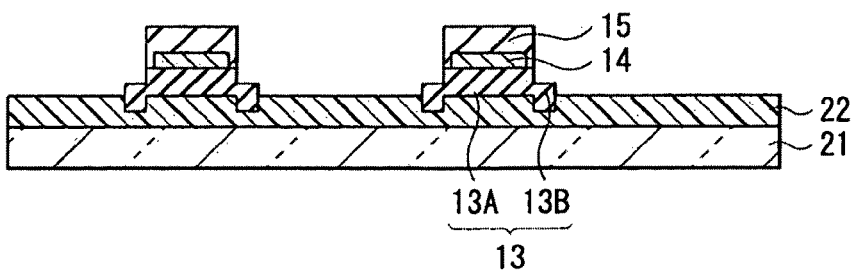

Next, as illustrated in FIG. 6B, the electronic device 14 on the interconnection substrate 31 is brought into close contact with the adhesion layer 22 provided on the surface of the second substrate 21. After that, when the interconnection substrate 31 is separated, as illustrated in FIG. 6C, the electronic device 14 is transferred from the interconnection substrate 31 onto the second substrate 21 (step S301). In the case where the adhesion layer 32 on the interconnection substrate 31 is made of silicone rubber, since the electronic device 14 is in the state of being temporarily bonded to the interconnection substrate 31, the electronic device 14 is easily transferred onto the second substrate 21. In the case where the adhesion layer 32 on the interconnection substrate 31 is made of resin whose adhesion strength is lowered by ultraviolet, it is necessary to transfer the electronic device 14 while applying the ultraviolet.

The electronic device 14 which is left in the first substrate 11 may be selectively and repeatedly transferred in the same way as described above. When all the electronic devices 14 are extracted, unnecessary components in the first substrate 11 are removed by etching, and the first substrate 11 may be reused. The first substrate 11 may be repeatedly used at the number expressed by formula 2.

Repeated use number $N$ of the first substrate 11=
(Number of the electronic devices 14 on the first substrate 11)/(Number of the electronic devices 14 necessary for the second substrate 21)        Formula 2

Figure 7:
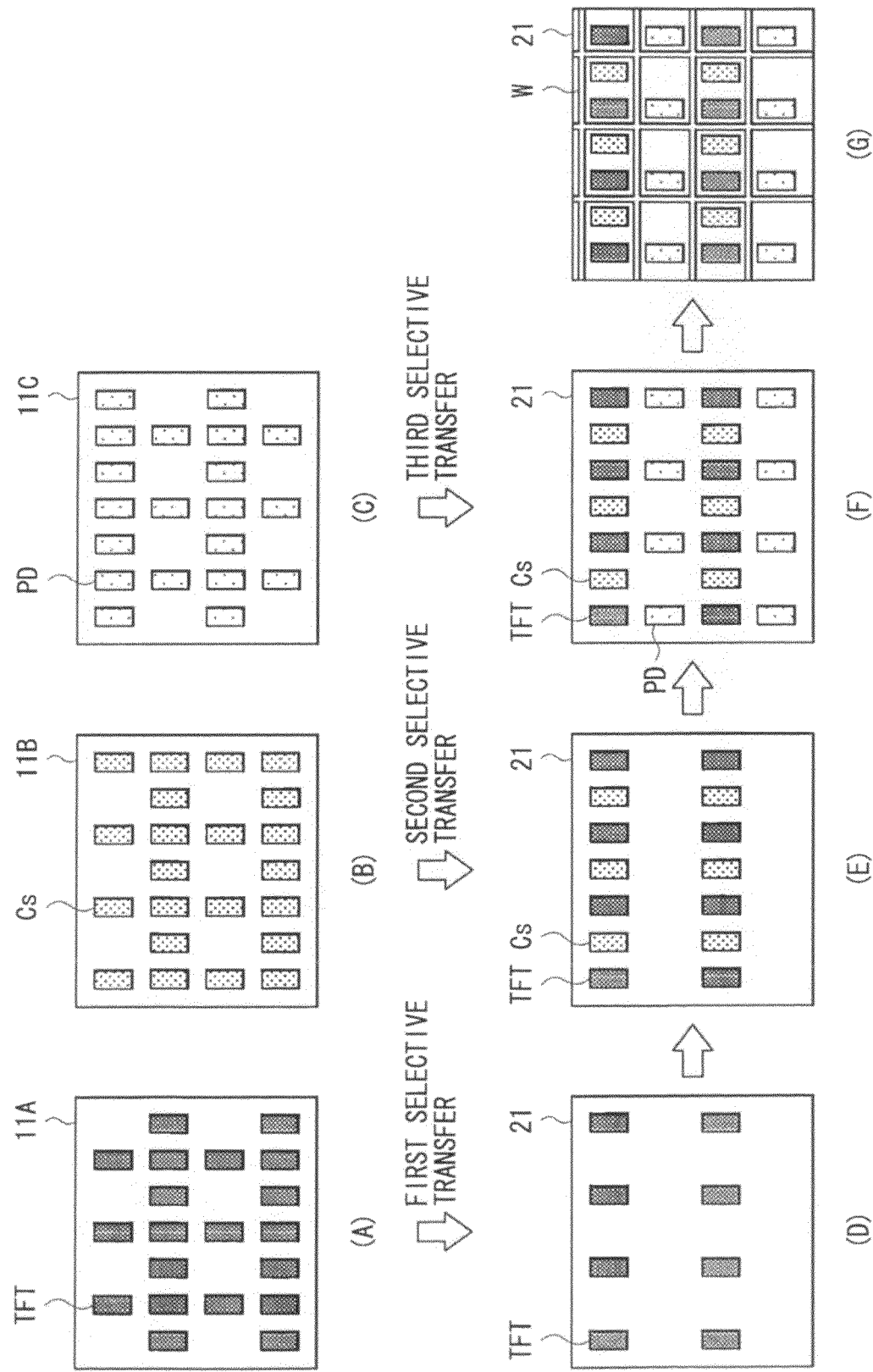
FIG. 7 is a view for explaining an application example of the manufacturing method illustrated in FIGS. 6A to 6D.

In such a selective transfer, for example, an application example as illustrated in FIG. 7 is possible. That is, first, as illustrated in part A to part C of FIG. 7, a TFT, a capacitor Cs, a light receiving element PD as the electronic devices 14 are formed on three separate substrates of the first substrates 11A, 11B, and 11C, respectively. Next, as illustrated in part D of FIG. 7, in a first selective transfer step, the TFT is transferred from the first substrate 11A onto the second substrate 21. Next, as illustrated in part E of FIG. 7, in a second selective transfer step, the capacitor Cs is additionally transferred from the first substrate 11B onto the second substrate 21. After that, as illustrated in part F of FIG. 7, in a third selective transfer step, the light receiving element PD is additionally transferred from the first substrate 11C onto the second substrate 21. After selectively transferring the light receiving element PD, as illustrated in part G of FIG. 7, a wiring W is formed between the transferred TFT, the transferred capacitor Cs, and the transferred light receiving element PD. A wiring step will be described later.

In this application example, the TFT, the capacitor Cs, and the light receiving element PD are formed on the separate first substrates 11A to 11C, and thereby it is possible to realize high performance of the individual elements. Generally, the TFT, the capacitor Cs, and the light receiving element PD are formed on a same substrate, and a part of layers are used in common from the viewpoint of a manufacturing process. Thus, there is a case where a design departed from the most desirable performance in terms of the individual elements is necessary. The first substrates 11A to 11C may be made of various materials such as synthetic quartz, silicon (Si), and a wafer. The selection range of the material for the second substrate 21 is increased in the same manner as the first embodiment. Since the electronic devices 14 may be arranged on the first substrate 11 at a high density, it is possible to reduce the amount of the material removed by etching or the like, and effective utilization is possible. Thereby, the high productivity is possible, and multi-face manufacturing is unnecessary.

Moreover, the electronic device 14 is repeatedly transferred onto the second substrate 21 which is larger than the first substrate 11, and thereby device manufacturing of a large substrate is possible. Although a transfer apparatus and a wiring formation step are necessarily applicable to a large substrate, a TFT manufacture step for the large substrate is unnecessary, and there is an advantage that initial equipment investment is highly suppressed.

Figure 6D:
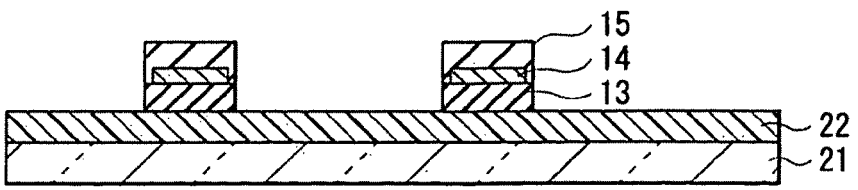

After transferring the electronic device 14 onto the second substrate 21, as illustrated in FIG. 6D, the fragment of the support body 13B belonging to the electronic device 14 is removed through the use of, for example, dry etching using fluorinated etching gas such as $CF_4$ (step S701), and only the body 13A is left.

Figure 8:
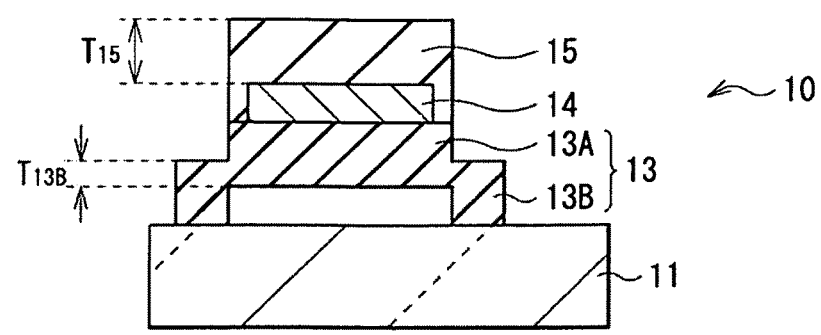
FIG. 8 is a cross sectional view illustrating a modification of FIG. 4.
Figure 9:
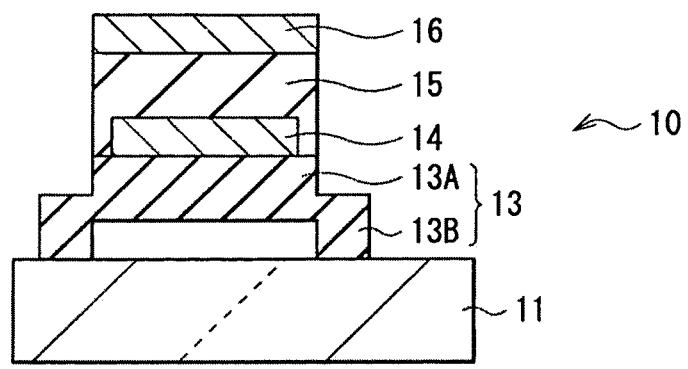
FIG. 9 is a cross sectional view illustrating another modification of FIG. 4.

At the time of removing the support body 13B, since the whole second substrate 21 is exposed to the etching gas, a part other than the support body 13B is necessarily suppressed from being etched as much as possible. Thus, as illustrated in FIG. 8, it is desirable to sufficiently increase a thickness T15 of the protective film 15 in comparison with a thickness T13B of the support body 13B. Alternatively, as illustrated in FIG. 9, it is desirable to form an etching stopper layer 16 on the protective layer 15. In the case of FIG. 9, the supporting layer 13 including the support body 13B is composed of oxide on which dry etching may be performed, such as $SiO_2$ or SiNx, and the etching stopper layer 16 is composed of a material having high etching resistance, such as metal. Specifically, examples of the material include titanium (Ti), chrome (Cr), molybdenum (Mo) or aluminum (Al).

Figure 10A:
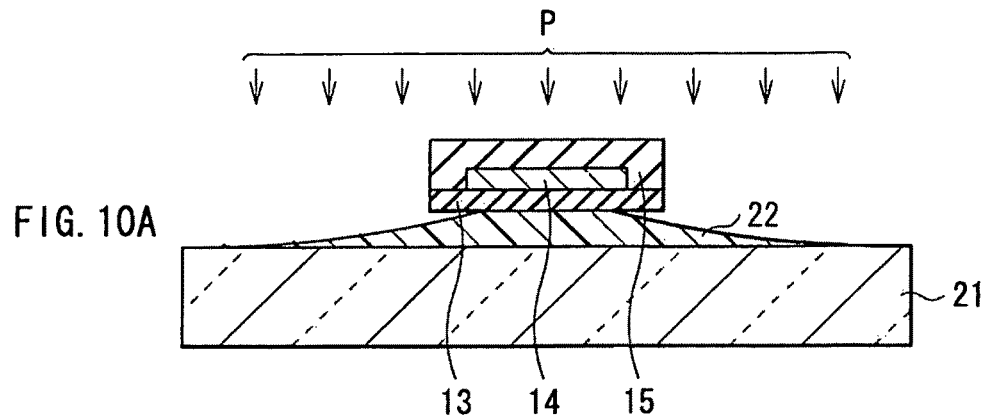
FIGS. 10A to 10C are cross sectional views illustrating a step subsequent to FIGS. 6A to 6D.

After removing the support body 13B, as illustrated in FIG. 10A, resin composing the adhesion layer 22 is decomposed through the use of ashing using plasma P which contains oxygen as a major component, and thereby the adhesion layer 22 is removed (step S702). By removing the adhesion layer 22, at the time of forming a structure such as a wiring layer, it is possible to suppress deterioration of the position accuracy caused by thermal deformation of the resin composing the adhesion layer 22.

Figure 10B:
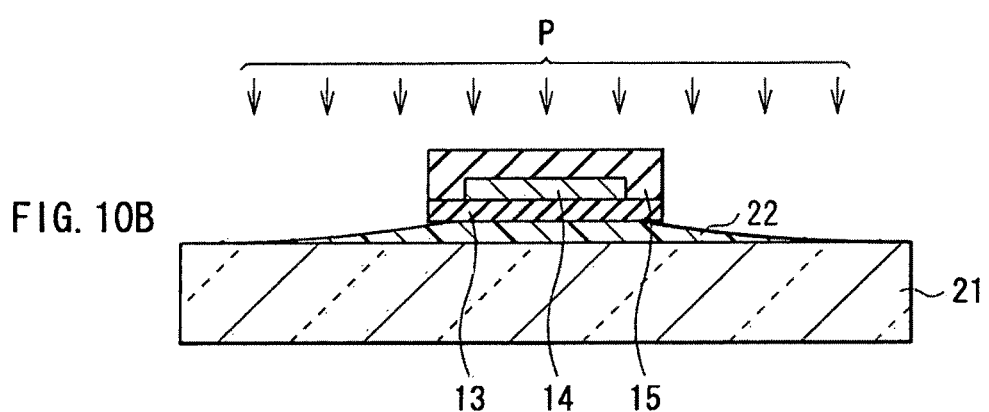
Figure 10C:
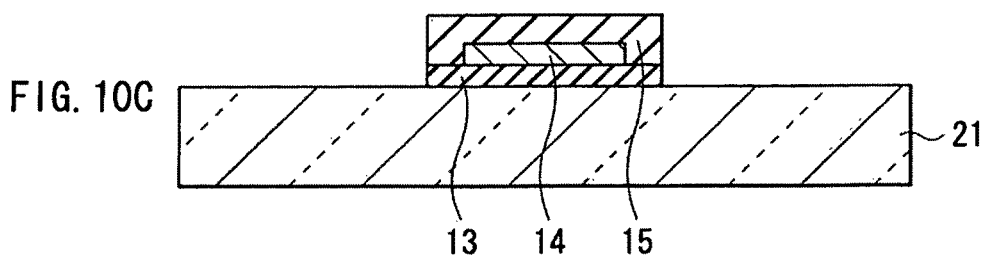

In the ashing, the conditions that etching anisotropy is low are used. For example, through the use of an RF plasma apparatus, the second substrate 21 is arranged on an anode, and an anode coupling mode in which plasma bias to the second substrate 21 is reduced is utilized. Thereby, as illustrated in FIG. 10B, the adhesion layer 22 below the electronic device 14 is isotropically gradually decomposed. Finally, as illustrated in FIG. 10C, the whole adhesion layer 22 is removed, and the state where the body 13A in the supporting layer 13 and the second substrate 21 are in direct contact with each other is realized.

Figure 11A:
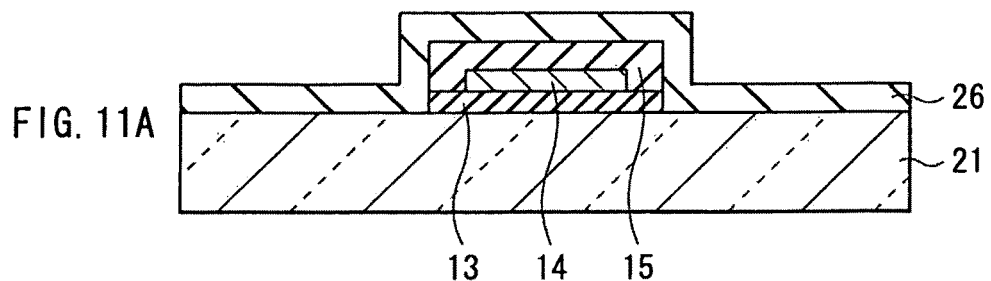
FIGS. 11A to 11C are cross sectional views illustrating a step subsequent to FIGS. 10A to 10C.

After removing the adhesion layer 22, as illustrated in FIG. 11A, a fixing layer 26 is formed on the surface of the electronic device 14 and the protective layer 15, and the surface of the second substrate 21 through the use of, for example, CVD method (step S703). In the state illustrated in FIG. 10C, the electronic device 14 is not fixed onto the second substrate 21, and is only in close contact with the second substrate 21 by static electricity or Van der Waals' forces. However, by the fixing layer 26, it is possible to surely fix the electronic device 14 onto the second substrate 21. The fixing layer 26 is desirably a continuous film made of a material whose heat resistance is high and whose Young' modules is large to suppress a position shift of the electronic device 14 caused by the influence of a subsequent heating step. Specifically, the fixing layer 26 has, for example, a thickness of 10 nm to 500 nm both inclusive, and is composed of $SiO_2$ or SiNx.

Figure 11B:
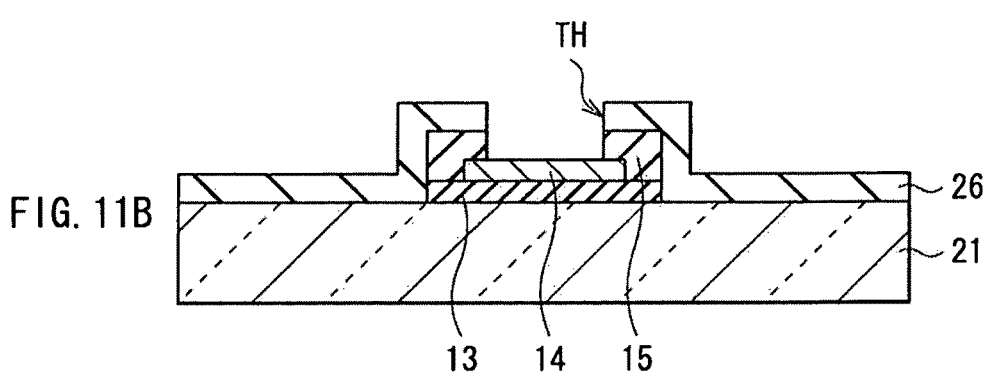

After forming the fixing layer 26, as illustrated in FIG. 11B, a contact hole TH is provided in the fixing layer 26 and the protective layer 15 through the use of, for example, etching (step S704). The contact hole TH is intended to connect a wiring to the electronic device 14, and is formed so as to expose a part of an electrode of the electronic device 14. In the case where the etching stopper layer 16 is formed on the protective layer 15 as illustrated in FIG. 9, the etching stopper layer 16 is removed in a step of providing the contact hole TH.

Figure 11C:
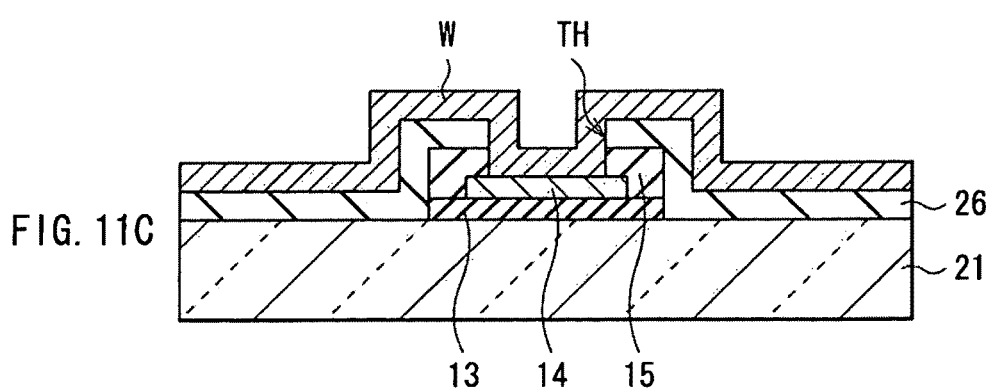

After providing the contact hole TH in the fixing layer 26 and the protective layer 15, as illustrated in FIG. 11C, the wiring W is connected to the electronic device 14 through the contact hole TH (step S705). In the case where the interconnection substrate 31 is not used at the time of transferring the electronic device 14, the supporting layer 13 and the fixing layer 26 are arranged on the top face of the transferred electronic device 14, and the wiring W is connected to the electronic device 14 through the contact hole provided in the supporting layer 13 and the fixing layer 26.

In this manner, in this embodiment, since the adhesion layer 22 is removed after transferring the electronic device 14 onto the second substrate 21, at the time of forming the structure such as the wiring layer, it is possible to suppress the deterioration of the position accuracy caused by the thermal deformation of the resin composing the adhesion layer 22. Moreover, since the fixing layer 26 is formed on the surface of the electronic device 14 and the protective layer 15, and the surface of the second substrate 21 after removing the adhesion layer 22, the electronic device 14 is surely fixed onto the second substrate 21, and it is possible to suppress the position shift or the like of the electronic device 14.

2. Second Embodiment

Figure 12:
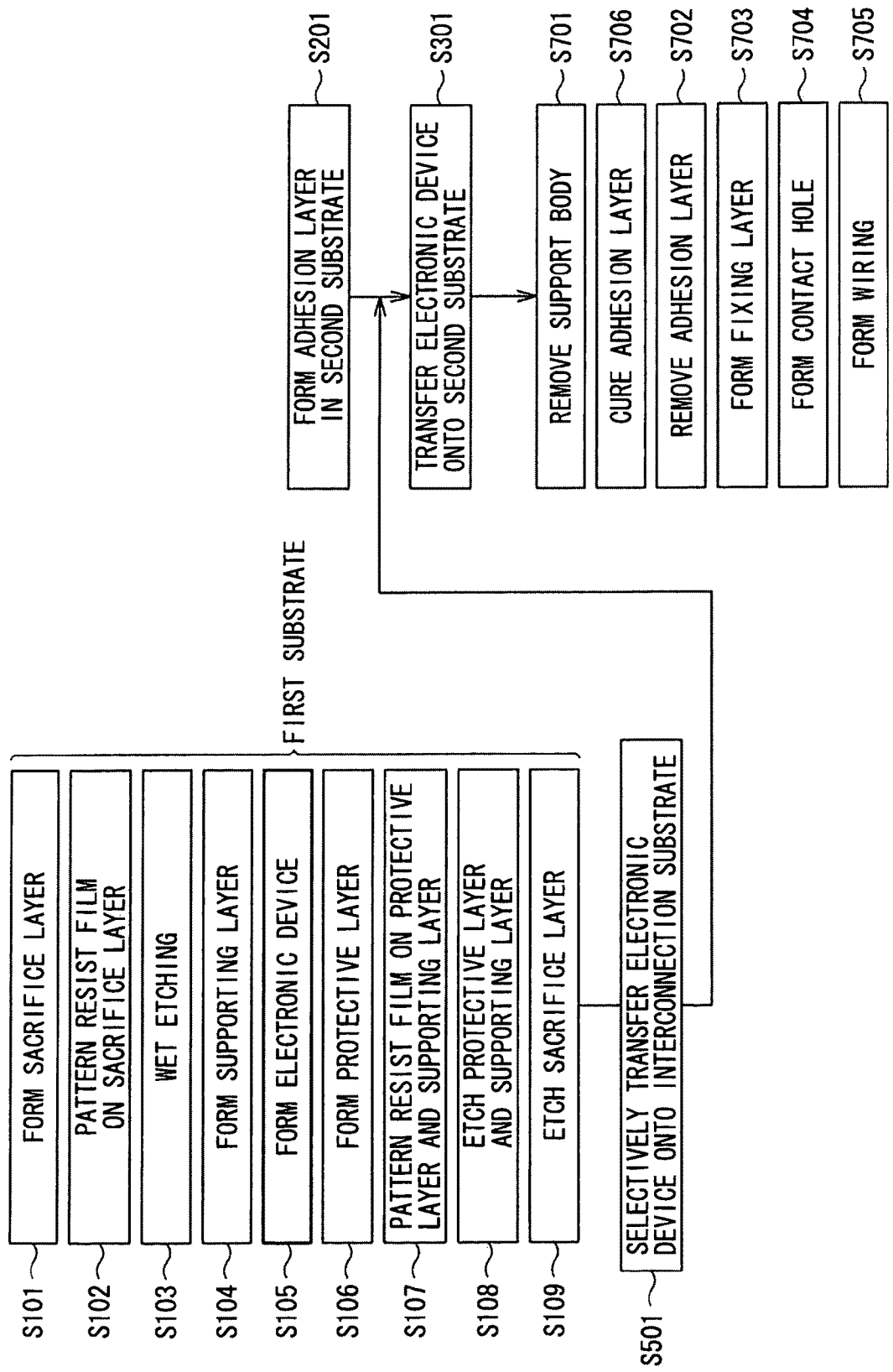
FIG. 12 is a flow chart illustrating a flow of the method of manufacturing the electronic device according to a second embodiment of the present invention.

FIG. 12 illustrates a schematic flow of the method of manufacturing the electronic device according to a second embodiment of the present invention, and FIGS. 13A to 13D, and 14A to 14C illustrate the manufacturing method in a step order. In this embodiment, the adhesion layer 22 is composed of ultraviolet curable resin, and only an exposed region 22D not covered with the electronic device 14 is removed after curing the adhesion layer 22. Steps identical to those of the first embodiment will be described with reference to FIGS. 2A to 2E, 3, 4, 5, 6A to 6D, 7, 8, 9, 10A to 10C, and 11A to 11C.

First, in the same manner as the first embodiment, by the steps illustrated in FIGS. 2A to 2E, and 3, the sacrifice layer 12, the supporting layer 13, the electronic device 14, and the protective layer 15 are formed in the first substrate 11, and the part of the protective layer 15 and the part of the supporting layer 13 are removed so as to expose at least the part of the sacrifice layer 12 (steps S101 to S108).

Next, in the same manner as the first embodiment, by the step illustrated in FIG. 4, the sacrifice layer 12 is removed through the use of etching (step S109).

Next, in the same manner as the first embodiment, by the step illustrated in FIG. 6A, the adhesion layer 32 including the convex section 32C is formed in the interconnection substrate 31. The convex section 32C may be formed through the use of the replica method and the direct processing method in the same manner as the first embodiment. After that, in the same manner as the first embodiment, by the step illustrated in FIG. 6A, the electronic device 14 on the first substrate 11 is brought into close contact with the convex section 32C in the adhesion layer 32 of the interconnection substrate 31, and the first substrate 11 is separated. Only the electronic device 14 in contact with the convex section 32C is selectively transferred onto the interconnection substrate 31 (step S501).

After selectively transferring the electronic device 14 onto the interconnection substrate 31, in the same manner as the first embodiment, by the step illustrated in FIG. 6B, the second substrate 21 is prepared, and the adhesion layer 22 is formed on the surface of the second substrate 21 (step S201). At that time, the adhesion layer 22 is composed of ultraviolet curable resin.

Figure 13A:
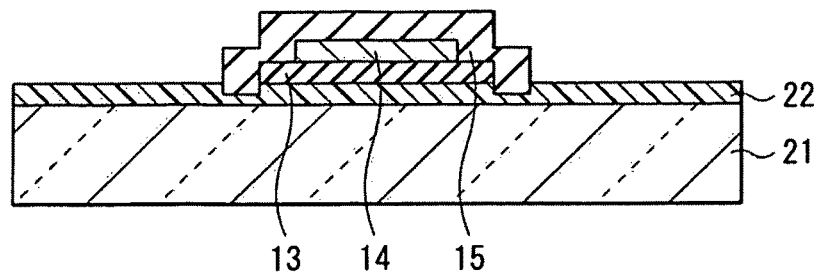
FIGS. 13A to 13D are cross sectional views illustrating the manufacturing method illustrated in FIG. 12 in a step order.

Next, in the same manner as the first embodiment, as illustrated in FIG. 6B, the electronic device 14 on the interconnection substrate 31 is brought into close contact with the adhesion layer 22 provided on the surface of the second substrate 21. After that, when the interconnection substrate 31 is separated, as illustrated in FIG. 13A, the electronic device 14 is transferred from the interconnection substrate 31 onto the second substrate 21 (step S301).

Figure 13B:
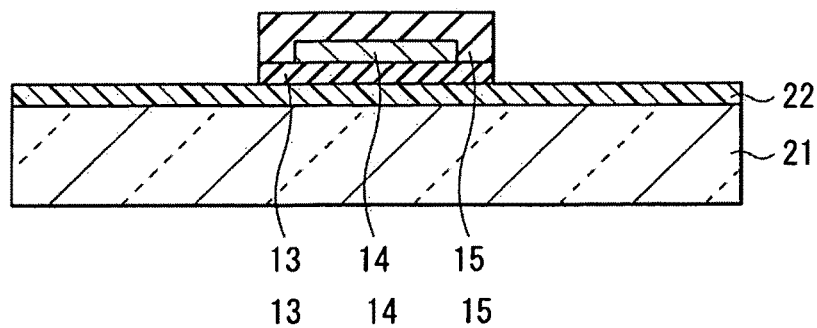

After transferring the electronic device 14 onto the second substrate 21, as illustrated in FIG. 13B, in the same manner as the first embodiment, the fragment of the support body 13B belonging to the electronic device 14 is removed through the use of, for example, dry etching by the step illustrated in FIG. 6D (step S701), and only the body 13A is left.

Figure 13C:
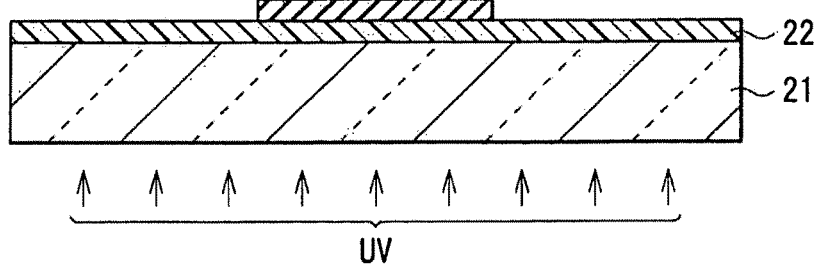

After removing the support body 13B, as illustrated in FIG. 13C, an ultraviolet UV is irradiated from the rear side of the second substrate 21, and thereby the adhesion layer 22 is cured (step S706).

Figure 13D:
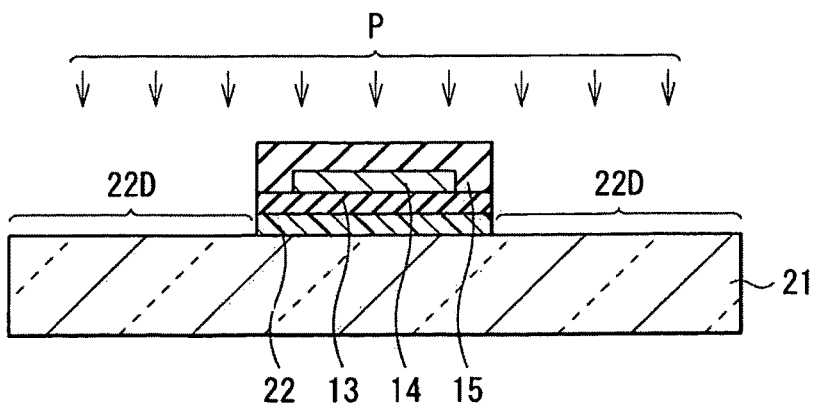

After curing the adhesion layer 22, as illustrated in FIG. 13D, while a region in the adhesion layer 22 covered with the electronic device 14 is left, only the exposed region 22D not covered with the electronic device 14 is removed through the use of ashing with plasma P which contains oxygen as a major component (step S702). In this manner, by removing only the exposed region 22D after curing the adhesion layer 22, it is possible to suppress deformation of the adhesion layer 22 in the heating step which will be described later. Moreover, at the time of forming the structure such as the wiring layer, it is possible to suppress the deterioration of the position accuracy caused by the thermal deformation of the resin composing the adhesion layer 22. In the ashing, for example, like an RIE (reactive ion etching) mode, the conditions that there is etching anisotropy are desirable.

Figure 14A:
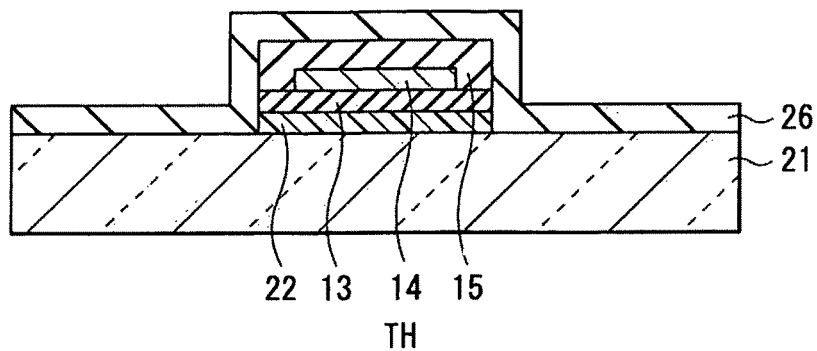
FIGS. 14A to 14C are cross sectional views illustrating a step subsequent to FIGS. 13A to 13D.

After removing the exposed region 22D in the adhesion layer 22, as illustrated in FIG. 14A, in the same manner as the first embodiment, by the step illustrated in FIG. 11A, the fixing layer 26 is formed on the surface of the electronic device 14 and the protective layer 15, and the surface of the second substrate 21 through the use of, for example, CVD method (step S703).

Figure 14B:
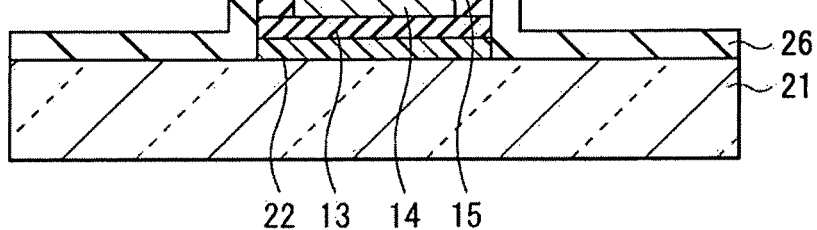

After forming the fixing layer 26, as illustrated in FIG. 14B, in the same manner as the first embodiment, by the step illustrated in FIG. 11B, the contact hole TH is provided in the fixing layer 26 and the protective layer 15 through the use of, for example, etching (step S704).

Figure 14C:
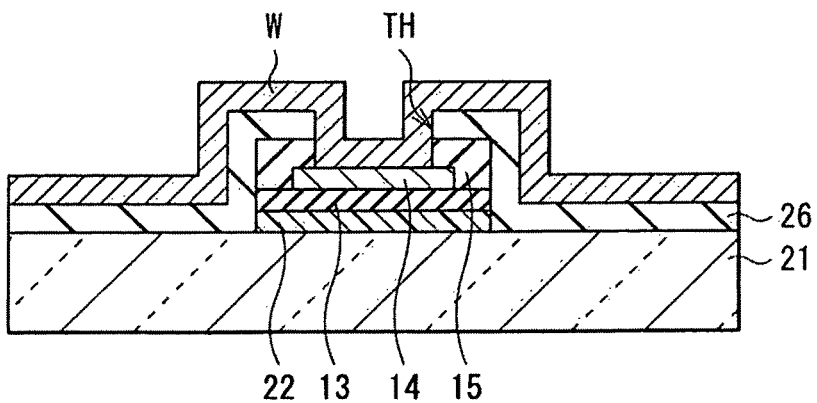

After providing the contact hole TH in the fixing layer 26 and the protective layer 15, as illustrated in FIG. 14C, the wiring W is connected to the electronic device 14 through the contact hole TH (step S705). In the case where the interconnection substrate 31 is not used at the time of transferring the electronic device 14, the supporting layer 13 and the fixing layer 26 are arranged on the top face of the transferred electronic device 14, and the wiring W is connected to the electronic device 14 through the contact hole provided in the supporting layer 13 and fixing layer 26.

In this manner, in this embodiment, the adhesion layer 22 is composed of the ultraviolet curable resin, and only the exposed region 22D is removed after curing the adhesion layer 22, thereby it is possible to suppress deformation of the adhesion layer 22 in the heating step which will be described later, in addition to the effects of the first embodiment.

3. Third Embodiment

Figure 15:
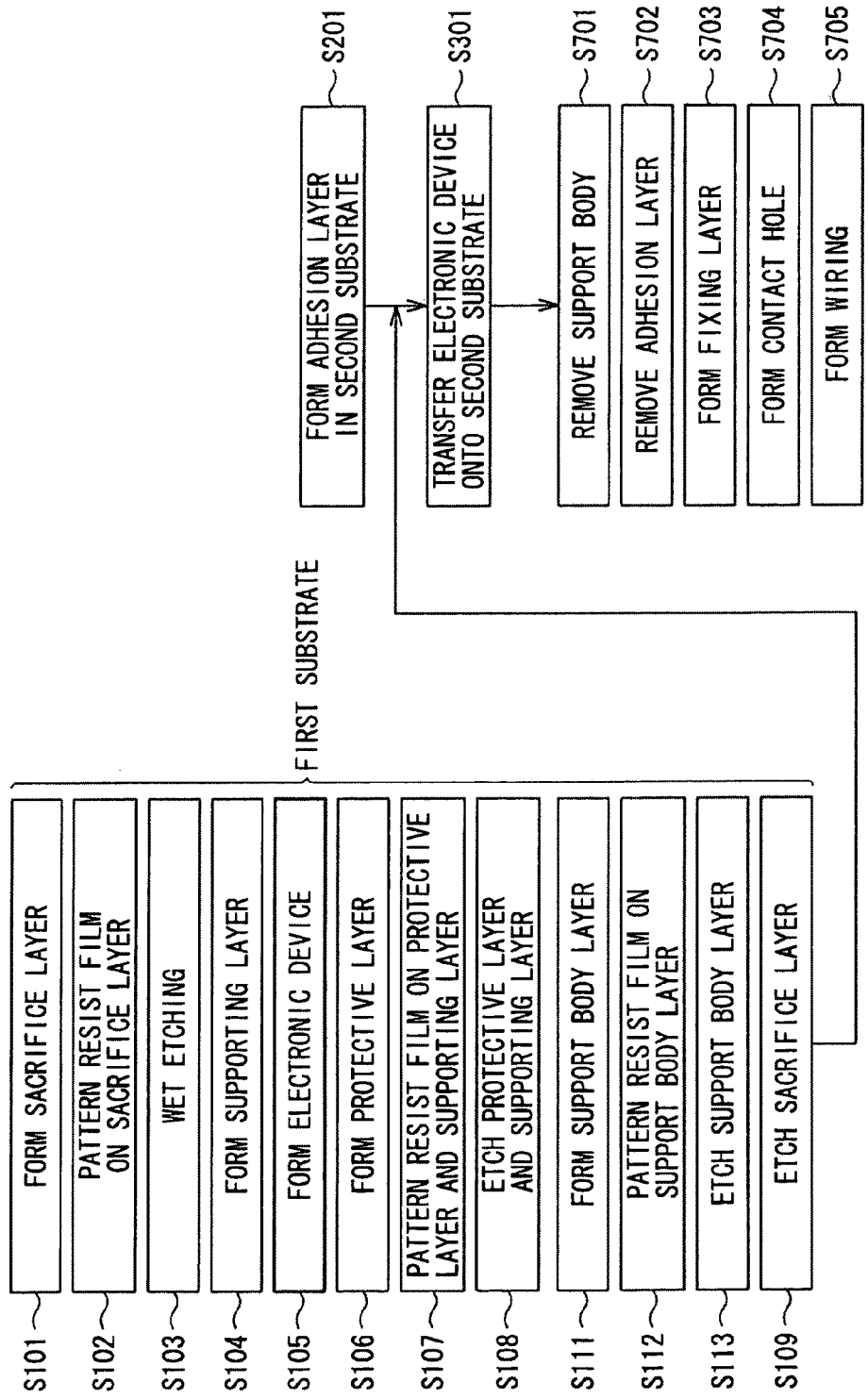
FIG. 15 is a flow chart illustrating a flow of the method of manufacturing the electronic device according to a third embodiment of the present invention.

FIG. 15 illustrates a schematic flow of the method of manufacturing the electronic device according to a third embodiment of the present invention, and FIGS. 16A and 16B, 17, and 18 illustrate the manufacturing method in a step order. This embodiment differs from the first embodiment in that a support body is formed separately from the supporting layer 13. Therefore, steps identical to those of the first embodiment will be described by using the same reference numerals with reference to FIGS. 2A to 2E, 3, 4, 5, 6A to 6D, 7, 8, 9, 10A to 10C, and 11A to 11C.

First, in the same manner as the first embodiment, by the step illustrated in FIG. 2A, the sacrifice layer 12 made of at least one of the alkali metal oxide and the alkali earth metal oxide is formed in the first substrate 11 (Step S101).

Next, in the same manner as the first embodiment, by the step illustrated in FIG. 2B, the resist film not illustrated in the figure is formed on the sacrifice layer 12, and the resist film is patterned into a predetermined shape through the use of photolithography (step S102). Then, through the use of etching by using the resist film as a mask, the part of the sacrifice layer 12 is removed to pattern the sacrifice layer 12 into the predetermined shape (step S103). Thereby, the sacrifice layer 12 is formed in the part of the first substrate 11 (region where the electronic device will be formed).

Next, in the same manner as the first embodiment, by the step illustrated in FIG. 2C, the supporting layer 13 is formed on the whole surface of the first substrate 11 (step S104).

After that, in the same manner as the first embodiment, by the step illustrated in FIG. 2D, the electronic device 14 is formed on the sacrifice layer 12 with the supporting layer 13 in between (step S105).

After forming the electronic device 14, in the same manner as the first embodiment, by the step illustrated in FIG. 2E, the protective layer 15 is formed on the electronic device 14 (step S106).

After forming the protective layer 15, the resist film not illustrated in the figure is formed on the protective layer 15, and the resist film is patterned into the predetermined shape through the use of photolithography (step S107). As illustrated in FIG. 16A, the part of the protective layer 15 and the part of the supporting layer 13 are removed to expose at least the part of the sacrifice layer 12 through the use of dry etching or wet etching by using the resist film as a mask (step S108). At this time, the supporting layer 13 and the protective layer 15 are left only on the top face of the sacrifice layer 12, and the whole side face of the sacrifice layer 12 is exposed.

After removing the part of the protective layer 15 and the part of the supporting layer 13, as illustrated in FIG. 16B, a support body layer 17A is formed on the surface of the electronic device 14, the supporting layer 13, the protective layer 15, the sacrifice layer 12, and the first substrate 11 (step S111). The support body layer 17A has, for example, a thickness of 50 nm, and is preferably composed of a material resistant to a solution used for etching the sacrifice layer 12, and capable of being processed through the use of dry etching. Specifically, examples of the material for the support body layer 17A include amorphous silicon (a-Si), silicon dioxide ($SiO_2$), and silicon nitride (SiNx). Other examples of the material for the support body layer 17A include metal such as aluminum (Al) or molybdenum (Mo).

After forming the support body layer 17A, the resist film not illustrated in the figure is formed on the support body layer 17A, and the resist film is patterned into the predetermined shape through the use of photolithography (step S112). Next, as illustrated in FIG. 17, through the use of dry etching or wet etching by using the resist film as a mask, a part of the support body layer 17A is removed, and a support body 17 is formed (step S113). The support body 17 is placed, for example, on both sides of the supporting layer 13, the electronic device 14, and the protective layer 15. In this manner, by providing the support body layer 17A separately from the supporting layer 13, the support body layer 17A is composed of the material different from that of the supporting layer 13, and it is possible to independently control the thickness of the support body layer 17A and the supporting layer 13. Therefore, it is possible to realize both reliability of the electronic device 14, and easiness of the design parameter and the transfer.

Figure 18:
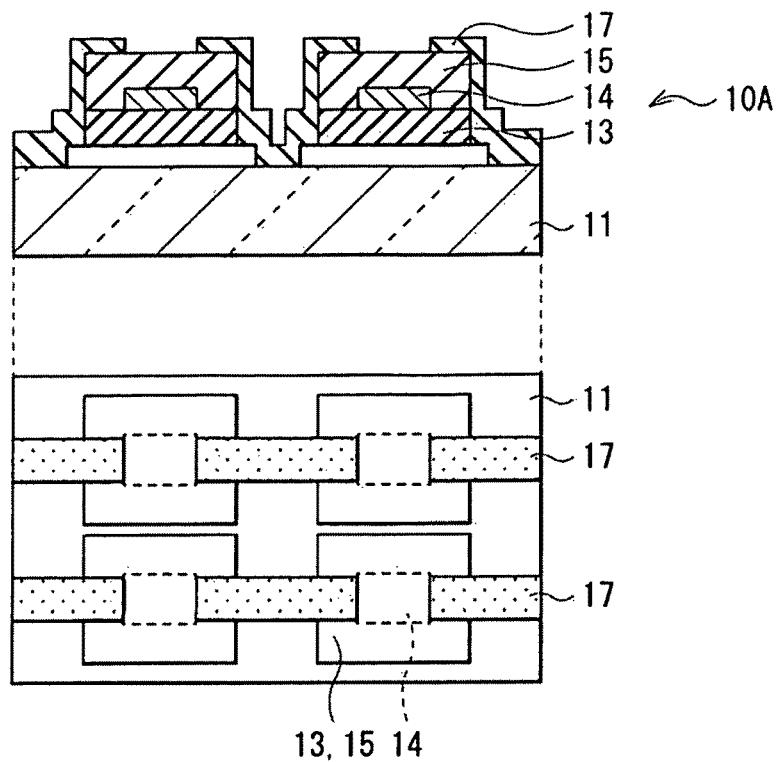
FIG. 18 is a cross sectional view and a plan view illustrating a step subsequent to FIG. 17.

After forming the support body 17, as illustrated in FIG. 18, the sacrifice layer 12 is removed by etching (step S109). Thereby, a transfer electronic device substrate 10A is formed.

In the transfer electronic device substrate 10A, the electronic device 14 is interposed between the supporting layer 13 and the protective layer 15, and the support body 17 is formed on both sides of the supporting layer 13, the electronic device 14, and the protective layer 15. Between the supporting layer 13 and the surface of the first substrate 11, there is the gap formed by removing the sacrifice layer 12, and the supporting layer 13, the electronic device 14, and the protective layer 15 are held floating in the air by the support body 17. In the transfer electronic device substrate 10A, in the same manner as the first embodiment, it is possible to transfer and fix the electronic device 14 onto the second substrate 21.

In this manner, in this embodiment, since the support body 17 is formed after leaving the supporting layer 13 only on the top face of the sacrifice layer 12, the supporting layer 13 and the support body 17 are composed of the materials different from each other, and it is possible to independently control the thickness of the supporting layer 13 and the support body 17. Therefore, it is possible to realize both reliability of the electronic device 14, and easiness of the design parameter and the transfer.

In this embodiment, although the case where the support body layer 17A or the support body 17 is formed separately from the protective layer 15 has been described, it is also possible to form and use the support body layer 17A or the support body 17, and the protective layer 15 in common.

FIRST APPLICATION EXAMPLE

Figure 19:
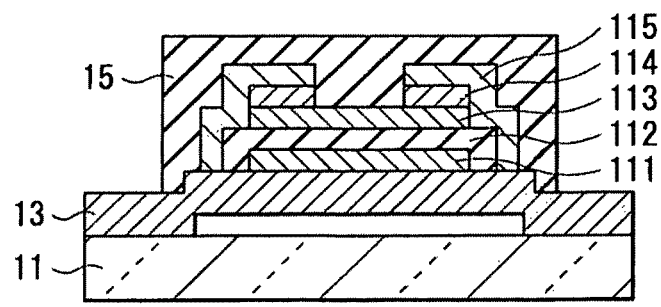
FIG. 19 is a cross sectional view illustrating another example of the electronic device.
Figure 20:
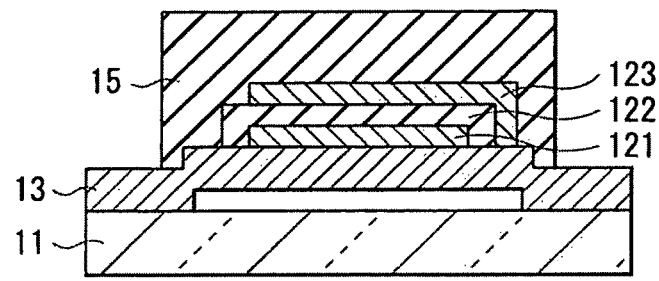
FIG. 20 is a cross sectional view illustrating still another example of the electronic device.
Figure 21:
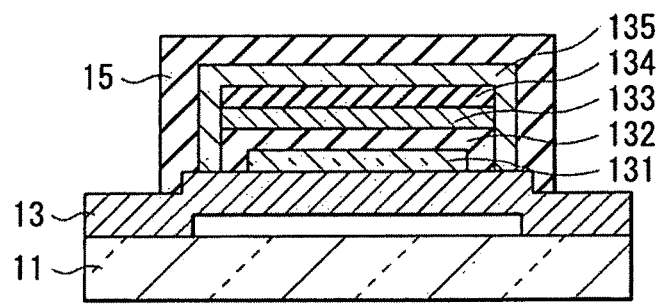
FIG. 21 is a cross sectional view further illustrating still another example of the electronic device.

The manufacturing method of the above embodiments is applicable to the various electronic devices 14, for example, as illustrated FIGS. 19 to 21. FIG. 19 illustrates an example of a TFT in which a gate electrode 111, a gate insulating film 112, a hydrogenated amorphous silicon layer 113, an n$^+$ amorphous silicon layer 114, and a source/drain electrode 115 are formed in this order on the supporting layer 13. The gate electrode 111 has, for example, a thickness of 200 nm, and is composed of chrome (Cr). The gate insulating film 112 has, for example, a thickness of 300 nm, and is composed of silicon nitride (SiNx). The hydrogenated amorphous silicon layer 113 has, for example, a thickness of 300 nm, and is composed of hydrogenated amorphous silicon (a-Si:H). The n+amorphous silicon layer 114 has, for example, a thickness of 50 nm, and is composed of n+amorphous silicon (n+a-Si:H). The source/drain electrode 115 has, for example, a thickness of 200 nm, and is composed of chrome (Cr).

FIG. 20 illustrates an example of a capacitor in which an electrode 121, an insulating film 122, and an electrode 123 are formed in this order on the supporting layer 13. The electrode 121 has, for example, a thickness of 200 nm, and is composed of chrome (Cr). The insulating film 122 has, for example, a thickness of 200 nm, and is composed of silicon dioxide ($SiO_2$). The electrode 123 has, for example, a thickness of 200 nm, and is composed of chrome (Cr).

FIG. 21 illustrates an example of an EL element (inorganic EL element) in which a transparent electrode 131, an insulating film 132, an EL layer 133, an insulating film 134, and an electrode 135 are formed in this order on the supporting layer 13. The transparent electrode 131 has, for example, a thickness of 400 nm, and is composed of ITO. The insulating film 132 has, for example, a thickness of 100 nm, and is composed of silicon dioxide ($SiO_2$). The EL layer 133 has, for example, a thickness of 1 µm, and is composed of ZnS:Mn. The insulating film 134 has, for example, a thickness of 5 µm, and is composed of SiNx. The electrode 135 has, for example, a thickness of 500 nm, and is composed of chrome (Cr).

SECOND APPLICATION EXAMPLE

The manufacturing method of the above embodiments is applicable to the case where an electronic device group 14A including the plurality of electronic devices 14 is formed on one sacrifice layer 12 with one supporting layer 13 in between, for example, as illustrated in FIGS. 22, 23A, 23B, and 24. Thereby, for example, an electric circuit or the like is easily transferable.

Figure 22:
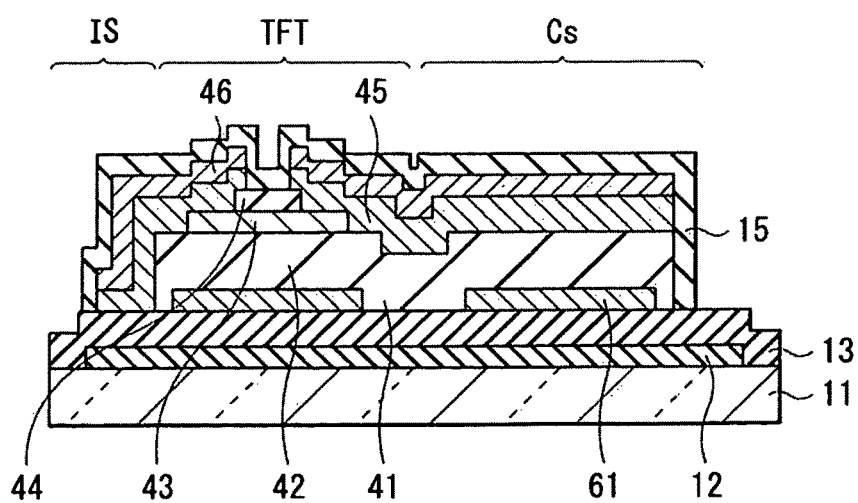
FIG. 22 is a cross sectional view illustrating an example of an electronic device group.

FIG. 22 illustrates, for example, the case where the TFT and the capacitor Cs are formed as the electronic device group 14A. The TFT includes, for example, a gate electrode 41, an insulating film 42, a hydrogenated amorphous silicon layer 43, an etching stopper layer 44, an amorphous silicon layer (n+a-Si:H) 45, and a source/drain electrode 46 in this order on the sacrifice layer 12 with the supporting layer 13 in between. The capacitor Cs includes, for example, a common electrode 61, the insulating film 42, and a facing electrode formed by deforming the source/drain electrode 46 on the sacrifice layer 12 with the supporting layer 13 in between.

Figure 23A:
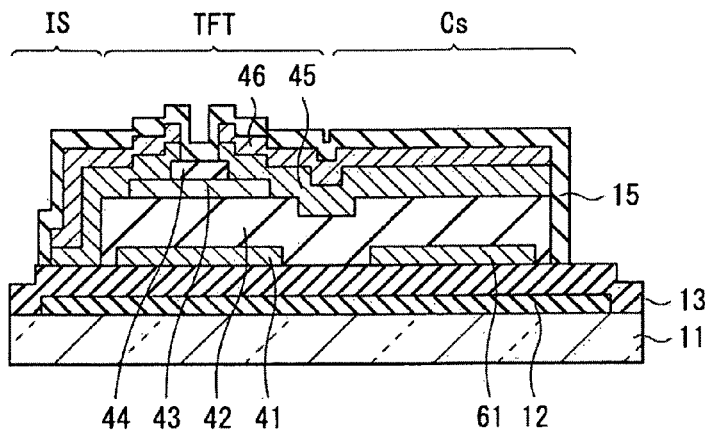
FIGS. 23A and 23B are a cross sectional view and a plan view illustrating another example of the electronic device group.
Figure 23B:
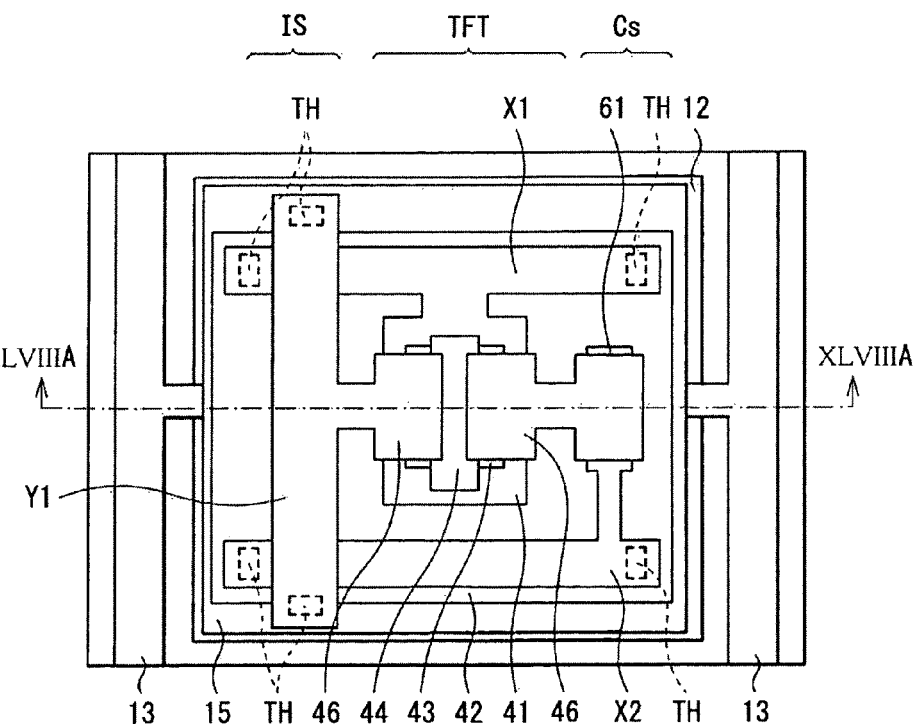

FIGS. 23A and 23B illustrate, for example, the case where in addition to the TFT and the capacitor Cs, an intersection IS of wirings is formed as the electronic device group 14A. The intersection IS includes, for example, an intersection of a gate wiring X1 and a drain wiring Y1, and an intersection of a wiring X2 and a drain wiring Y1.

Figure 24:
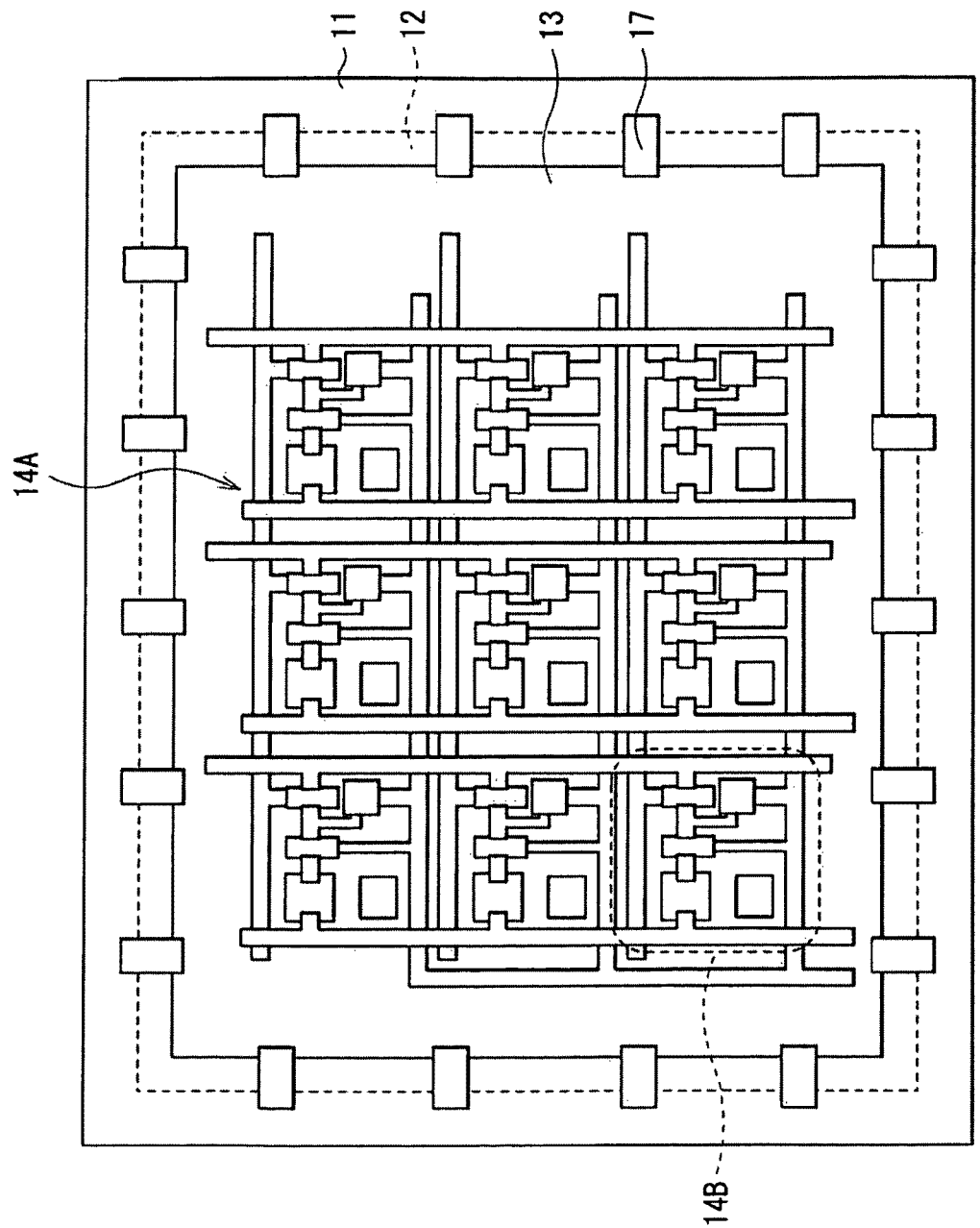
FIG. 24 is a plan view illustrating still another example of the electronic device group.
Figure 25:
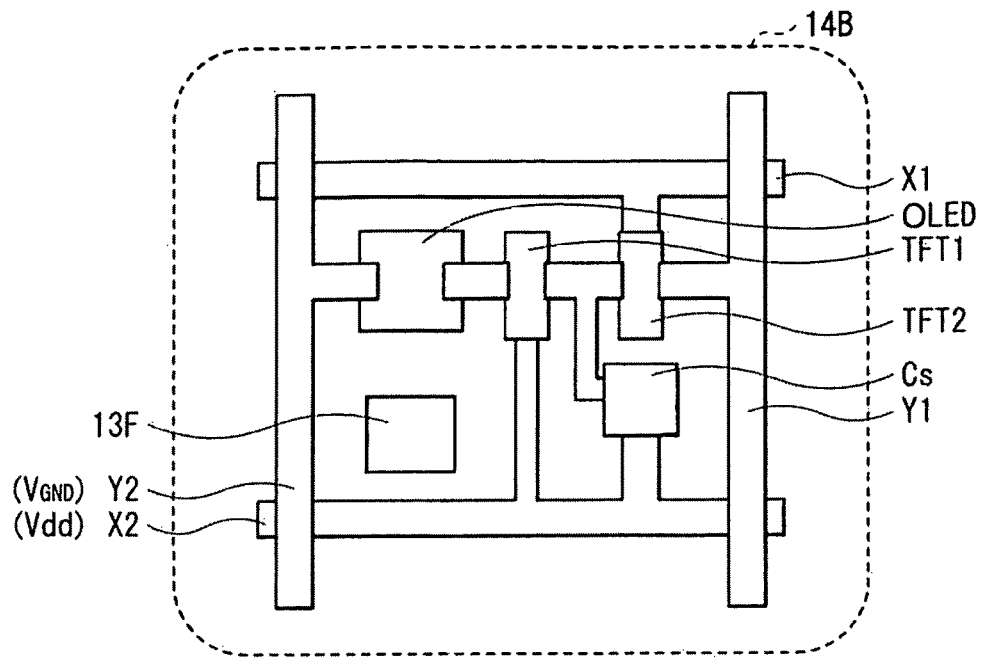
FIG. 25 is a plan view illustrating a part of the electronic device group illustrated in FIG. 24 in an enlarged manner.
Figure 26:
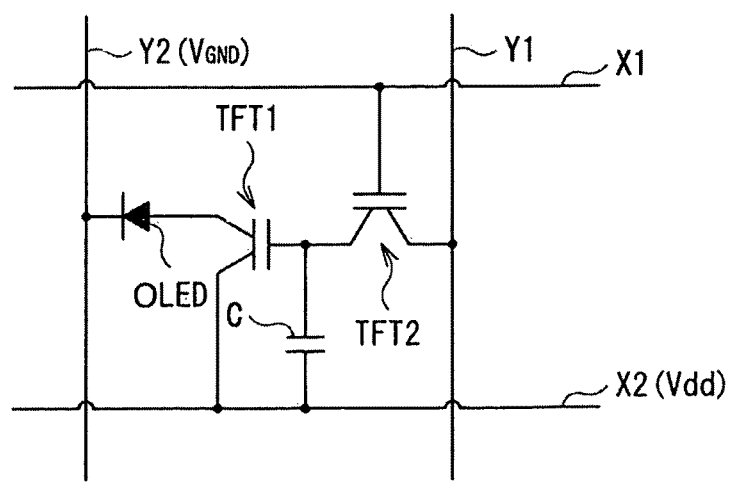
FIG. 26 is a view illustrating an equivalent circuit of the electronic device group illustrated in FIG. 25.

FIG. 24 illustrates, for example, the case where an active matrix drive circuit for an organic EL display is formed as the electronic device group 14A. FIG. 25 illustrates a part of the electronic device group 14A surrounded by a dotted line 14B in FIG. 24 in an enlarged manner, and FIG. 26 illustrates an equivalent circuit thereof. In FIG. 24, the sacrifice layer 12 is illustrated with a dotted line.

The sacrifice layer 12 and the supporting layer 13 are formed corresponding to the whole electronic device group 14A. On the periphery of the sacrifice layer 12 and the supporting layer 13, the plurality of support bodies 17 are arranged at appropriate intervals.

The supporting layer 13 preferably includes a through-hole 13F exposing the sacrifice layer 12, at the position avoiding the position of the electronic device 14. In this case, it is possible to etch the sacrifice layer 12 from the through-hole 13F, and it is possible to reduce time necessary for etching even in the case of the sacrifice layer 12 having a large area. In the through-hole 13F, there may be the support body 17, or there may be no support body 17.

The electronic device group 14A is an active drive circuit including a TFT 1, a TFT 2, the capacitor Cs, and an organic EL element OLED. In the TFT 2, its gate is connected to the corresponding gate wiring X1, its drain is connected to the corresponding drain wiring Y1, and its source is connected to a gate of the TFT 1. In the TFT 1, its drain is connected to the corresponding wiring X2, and its source is connected to an anode of the organic EL element OLED. A cathode of the organic EL element OLED is connected to a ground wiring Y2. The ground wiring Y2 is connected in common to all the organic EL elements OLED. A retention capacity Cs is connected between the drain and the gate of the TFT 1.

The TFT 2 is rendered conductive in response to a control signal supplied from the gate wiring X1, and samples a signal potential of a video signal supplied from the drain wiring Y1 to retain the signal potential in the capacitor Cs. The TFT 1 receives a current supply from the wiring X2 in a power source potential Vdd, and supplies a drive current to the organic EL element OLED in accordance with the signal potential retained in the capacitor Cs. The organic EL element OLED emits light at a luminance in accordance with the signal potential of the video signal by the supplied drive current.

THIRD APPLICATION EXAMPLE

Figure 27:
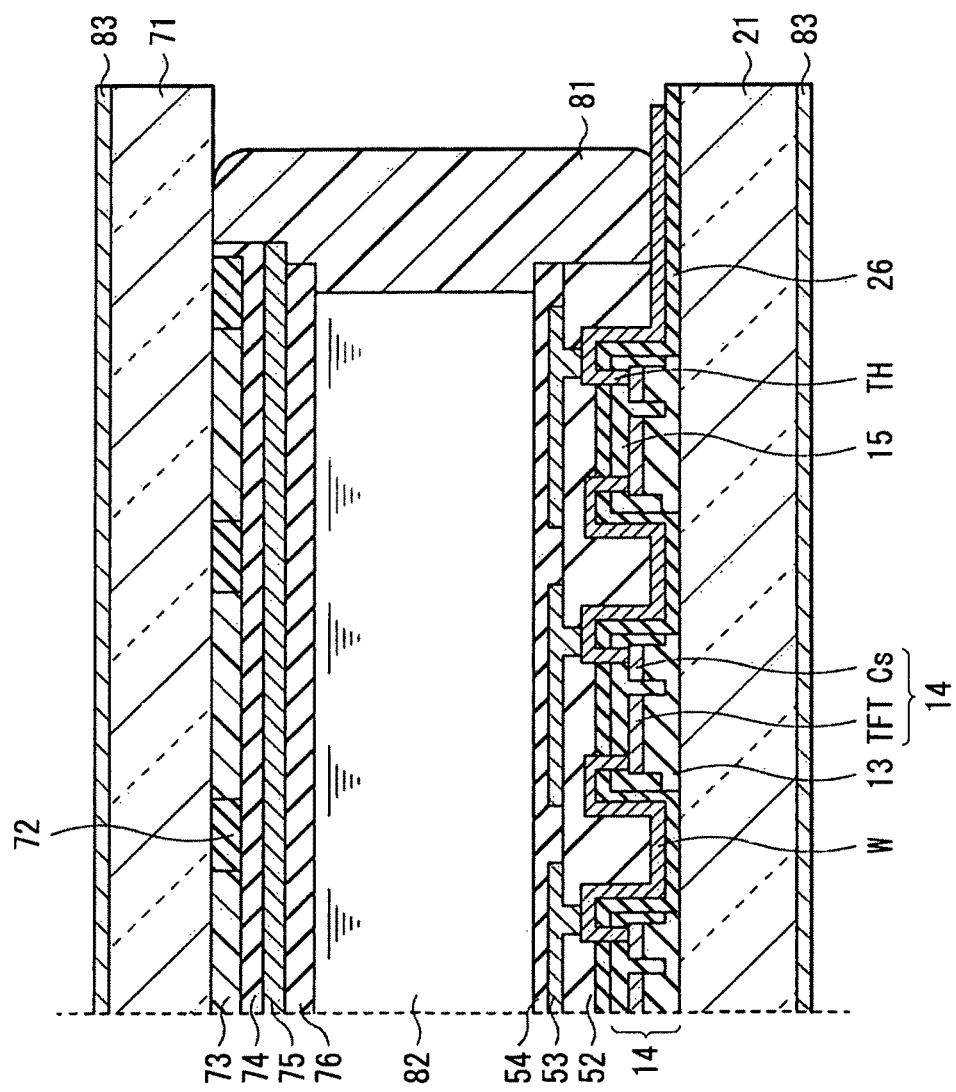
FIG. 27 is a cross sectional view illustrating the configuration of a liquid crystal display to which the present invention is applied.

FIG. 27 illustrates the cross sectional configuration of a liquid crystal display composed of an active matrix TFT substrate including the electronic device group 14A including the TFT and the capacitor Cs illustrated in FIGS. 23A and 23B. The liquid crystal display is used as, for example, a liquid crystal television, and has the configuration in which the second substrate 21 as being the active matrix TFT substrate, and a facing substrate 71 made of glass face each other. The periphery of the second substrate 21 and the facing substrate 71 is sealed by a sealing agent 81, and a liquid crystal layer 82 made of liquid crystal is provided inside the second substrate 21, the facing substrate 71 and the sealing agent 81. Polarizing plates 83 are provided outside the second substrate 21, and the facing substrate 71, respectively. The second substrate 21 corresponds to a specific example of "substrate" of the display of the present invention.

On the second substrate 21, the electronic device group 14A transferred by the method of the above embodiments is arranged. On the bottom face of the electronic device 14 (the TFT and the capacitor CS), the supporting layer 13 is formed. On the surface of the electronic device 14 and the protective layer 15, and the surface of the second substrate 21, the fixing layer 26 is formed. The electronic device 14 is connected to the wiring W through the contact hole TH provided in the fixing layer 26 and the protective layer 15, and a transparent electrode 53 is formed on the electronic device 14 with an interlayer insulating film 52 in between. On the surface of the transparent electrode 53, an alignment film 54 is formed. In the case where the interconnection substrate 31 is not used at the time of transferring the electronic device 14, the supporting layer 13 and the fixing layer 26 are arranged on the top face of the transferred electronic device 14, and the wiring W is connected to the electronic device 14 through the contact hole provided in the supporting layer 13 and the fixing layer 26.

In the facing substrate 71, a light shielding film 72 as a black matrix, a red, green, and blue color filter 73, an overcoat layer 74, a transparent electrode 75 made of ITO, and an alignment film 76 are formed in this order. A liquid crystal display element is composed of the transparent electrode 53, the liquid crystal layer 82, and the transparent electrode 75.

First Modification

Figure 28:
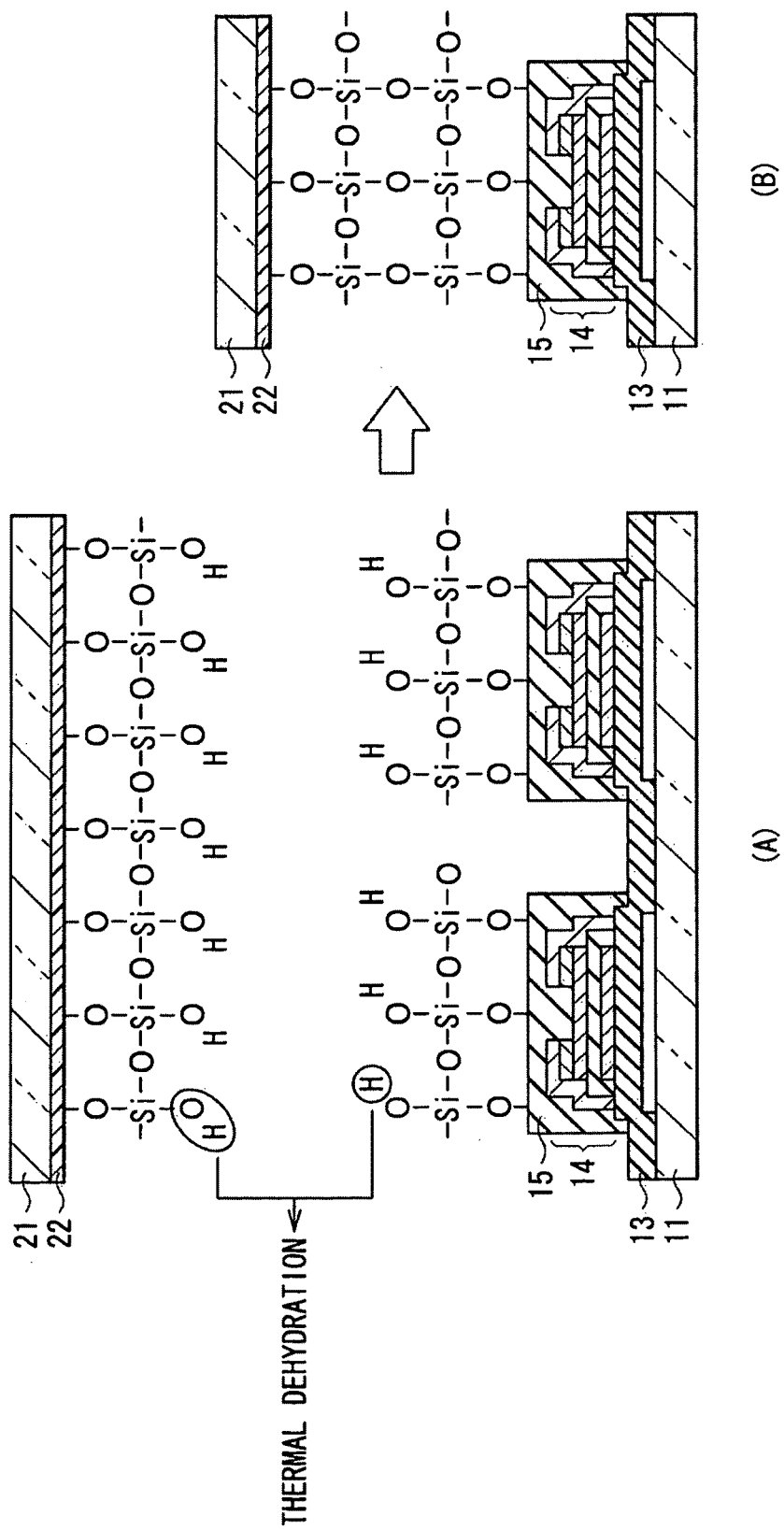
FIG. 28 is a view for explaining an example of an additional fixing method of the electronic device onto a second substrate.
Figure 29:
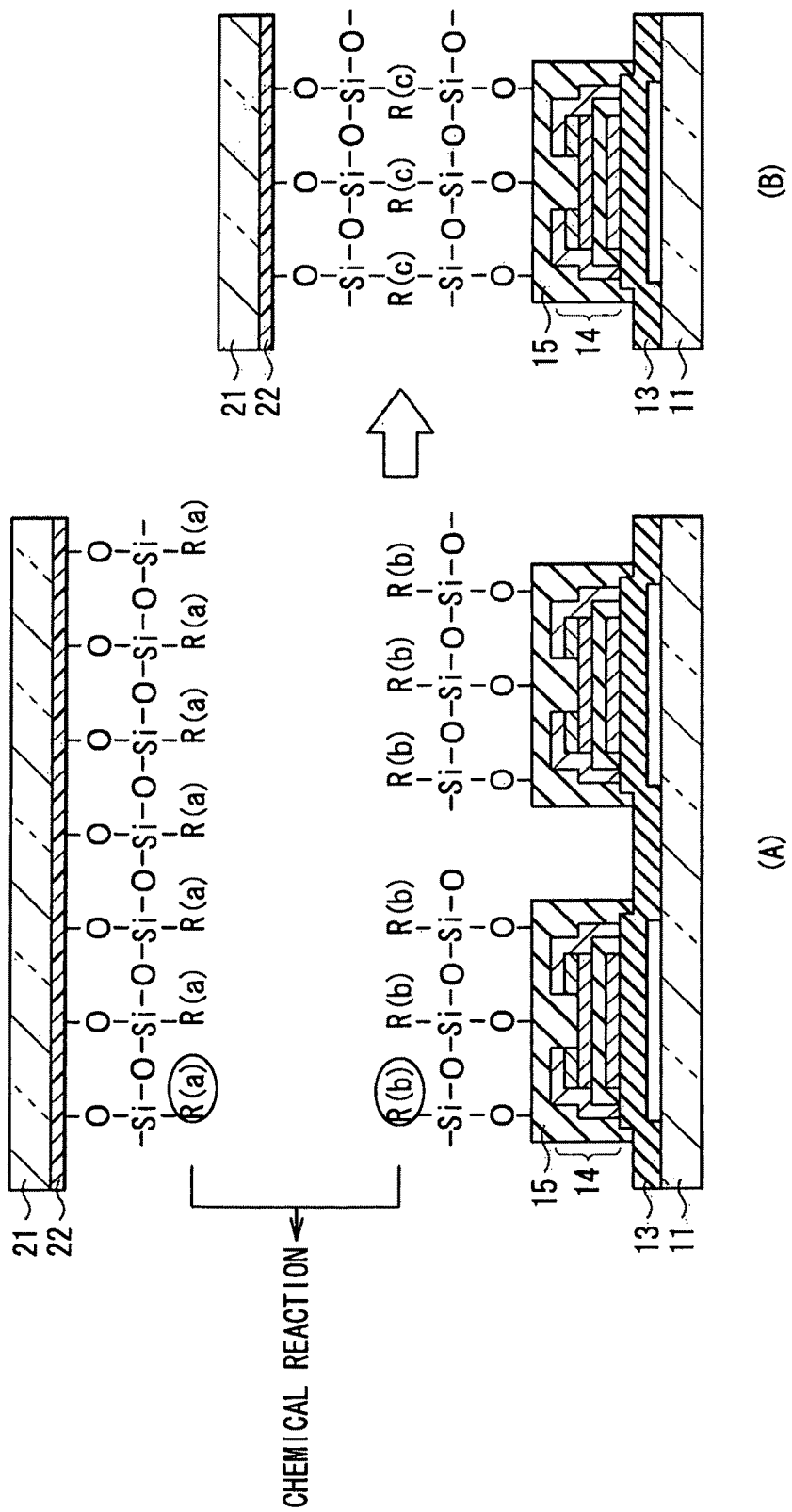
FIG. 29 is a view for explaining another example of the additional fixing method of the electronic device onto the second substrate.
Figure 30:
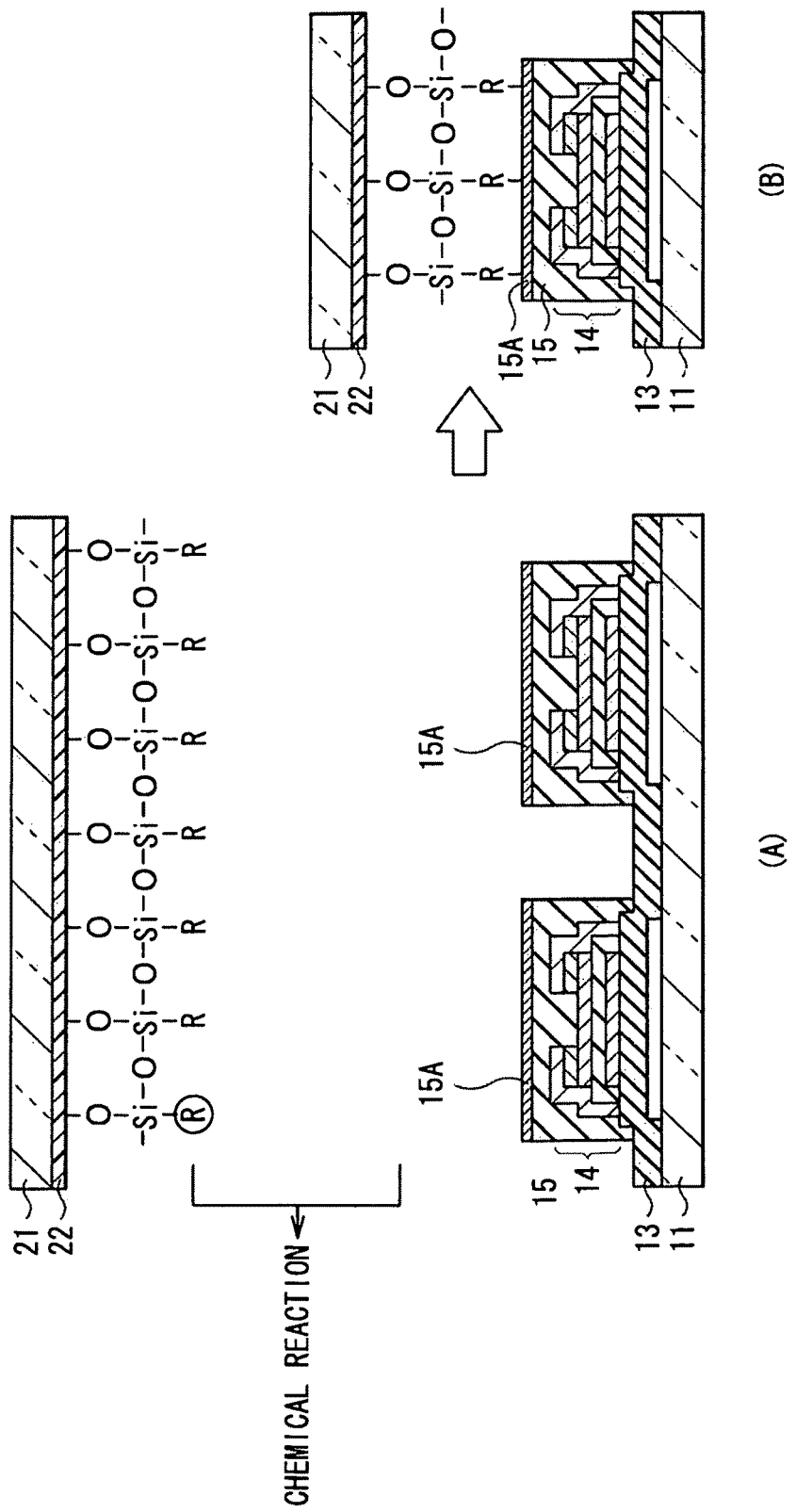
FIG. 30 is a view for explaining still another example of the additional fixing method of the electronic device onto the second substrate.

FIGS. 28 to 30 illustrate additional processes so as to fix the electronic device 14 more firmly onto the second substrate 21 after transferring the electronic device 14 onto the second substrate 21 in the above embodiments. FIGS. 28 to 30 illustrate the case where the TFT illustrated in FIG. 19 is formed as the electronic device 14.

First Additional Fixing Method

For example, as illustrated in part A of FIG. 28, the surface of the electronic device 14 or the protective layer 15, and the surface of the adhesion layer 22 are modified with a silanol group (SiOH), and are heated at approximately 120° C. and dehydrated after the transfer. Thereby, a Si—O—Si bond is formed and fixed as illustrated in part B of FIG. 28. At this time, on the surface of the electronic device 14 or the protective layer 15, a film made of oxide such as $SiO_2$ (not illustrated in the figure) is formed, and the film may be modified with a hydroxyl group through the use of $O_2$ plasma process, $UV$—$O_3$ process, or ozone water process.

Second Additional Fixing Method

As illustrated in part A of FIG. 29, on the surface of the electronic device 14 or the protective layer 15, and the surface of the adhesion layer 22, silane coupling agents having different characteristics but including functional groups chemically bonded due to contact with each other are deposited. As illustrated in part B of FIG. 29, the electronic device 14 or the protective layer 15, and the adhesion layer 22 which are processed in respective manners are brought into close contact with each other, and heated to promote the chemical bonding.

Examples of a combination of the silane coupling agents include the following.
1. A silane coupling agent including an isocyanate group and a silane coupling agent including an amino group
Example) An example of the silane coupling agent including the isocyanate group
3-isocyanatepropyltriethoxysilane
3-isocyanatepropyltrichlorosilane
Example) An example of the silane coupling agent including the amino group
N-2(aminoethyl) 3-aminopropylmethyldimethoxysilane
N-2(aminoethyl) 3-aminopropyltrimethoxysilane
3-aminopropyltrimethoxysilane
2. A silane coupling agent including an epoxy group and a silane coupling agent including an amino group
Example) An example of the silane coupling agent including the epoxy group
2-(3,4 epoxycyclohexyl)ethyltrimethoxysilane
3-glycidoxypropyltrimethoxysilane
3-glycidoxypropyltriethoxysilane
Example) an example of the silane coupling agent including the amino group
N-2(aminoethyl) 3-aminopropylmethyldimethoxysilane
N-2(aminoethyl) 3-aminopropyltrimethoxysilane
3-aminopropyltrimethoxysilane Third Additional Fixing Method As illustrated in part A of FIG. 30, on the surface of the protective layer 15, a metal film 15A of specific metal, for example, Au, Ag, Cu, Pd, and Pt is formed, and the surface of the adhesion layer 22 is modified with a silane coupling agent including functional groups below. As illustrated in part B of FIG. 30, the electronic device 14 or the protective layer 15, and the adhesion layer 22 which are processed in respective manners are brought into close contact with each other, and heated to promote the chemical bonding.
1. Mercapto Group
Example) 3-mercaptopropylmethyldimethoxysilane
3-mercaptopropyltrimethoxysilane
2. Amino Group
Example) N-2(aminoethyl) 3-aminopropylmethyldimethoxysilane
N-2(aminoethyl) 3-aminopropyltrimethoxysilane
3-aminopropyltrimethoxysilane
3. Phenyl Group
Example) phenyltrimethoxysilane Hereinbefore, the present invention has been described with reference to the embodiments. However, the present invention is not limited to the embodiments, and various modifications may be made. For example, the material, the thickness, the deposition method, the deposition conditions and the like of each layer are not limited to those described in the above embodiments. Other material, other thickness, other deposition method, and other deposition conditions may be adopted.

In the above embodiments, the description has been specifically made by using the configuration of the TFT, the capacitor, and the like as the electronic device 14. However, it is not necessary to include all the layers, and other layers may be additionally included.

The present invention is applicable to a display using other display element such as an inorganic electroluminescence element, an electrodeposition type display element, or an electrochromic type display element in addition to the liquid crystal display element, and the organic EL display element.

In addition to the components described in the above embodiments, the electronic device 14 as an object to be transferred may be a diode, a solar power generating element, an image pickup device, an IC such as an RFID tag including a larger-scale circuit, an optical device, and an acoustic device such as a microphone. However, the electronic device 14 is not limited to these.

In the above embodiments, as the transfer electronic device substrate 10, the case where the sacrifice layer 12 is removed, and the gap is provided between the bottom face of the body 13A and the surface of the first substrate 11 so that the transfer is enabled immediately has been described. However, the sacrifice layer 12 is provided in a distribution stage or a transportation stage, and the sacrifice layer 12 may be removed before the transfer.

The present application contains subject matter related to that disclosed in Japanese Priority Patent Application JP 2009-068774 filed in the Japan Patent Office on Mar. 19, 2009, the entire contents of which is hereby incorporated by reference.

It should be understood by those skilled in the art that various modifications, combinations, sub-combinations and alternations may occur depending on design requirements and other factors insofar as they are within the scope of the appended claims or the equivalents thereof.

What is claimed is:
1. A method of manufacturing a device, the method comprising:
a step of forming an adhesion layer on a surface of a second substrate;

a step of transferring an electronic component from a first substrate to an interconnection substrate;

a step of relocating said electronic component from said interconnection substrate to said adhesion layer, a portion of the adhesion layer being between said electronic component and said surface during the step of relocating, and thereafter;

a step of removing said portion of the adhesion layer from a region of the surface, said electronic device being on said portion of the adhesion layer during the step of removing.

2. The method according to claim 1, wherein during the step of transferring, said electronic component and a different electronic component are simultaneously transferred from said first substrate to said interconnection substrate.

3. The method according to claim 1, wherein during the step of relocating, said electronic component and another electronic component are simultaneously transferred from said interconnection substrate to said adhesion layer.

4. The method according to claim 1, wherein said adhesion layer is partially removed from said surface during the step of removing.

5. The method according to claim 1, wherein said adhesion layer is completely removed from said surface during the step of removing.

6. The method according to claim 1, wherein said region of the surface is exposed during the step of removing.

7. The method according to claim 1, wherein said adhesion layer is an ultraviolet curable resin.

8. The method according to claim 1, wherein prior to the step of removing, the method further comprising:

a step of curing said adhesion layer with ultraviolet irradiation.

9. The method according to claim 8, wherein the step of curing comprises:

irradiating an opposite surface of the second substrate with said ultraviolet irradiation.

10. The method according to claim 1, wherein the step of removing comprises:

using plasma to remove said adhesion layer.

11. The method according to claim 10, wherein said plasma contains oxygen.

12. The method according to claim 1, wherein said electronic component includes a supporting body, a protective layer and an electronic device.

13. The method according to claim 12, wherein said electronic device is between said protective layer and said supporting body.

14. The method according to claim 12, wherein said supporting body comes into direct contact with said surface during the step of removing.

15. The method according to claim 12, wherein after the step of removing, the method further comprises:

a step of forming a fixing layer on said protective layer and said second substrate.

16. The method according to claim 15, wherein the method further comprises:

a step of forming a contact hole through said fixing layer and said protective layer, said contact hole extending to said electronic device.

17. The method according to claim 16, wherein the method further comprises:

a step of forming a wiring in said contact hole, said wiring being electrically connected to said electronic device.

18. The method according to claim 12, wherein prior to the step of transferring, the method further comprising:

a step of eliminating a residual portion of a sacrifice layer from between said first substrate and a supporting layer, said support body being a portion of the supporting layer that remains in contact with said first substrate.

19. The method according to claim 18, wherein during the step of transferring, the method further comprising:

a step of breaking said support body and removing said electronic component from said first substrate.

20. The method according to claim 18, wherein said sacrifice layer is from the group consisting of an alkali metal oxide and alkali earth metal oxide.

21. The method according to claim 18, wherein prior to the step of eliminating, the method further comprises:

a step of forming said protective layer on said electronic device, said supporting layer being between said electronic device and said residual portion of the sacrifice layer.

22. The method according to claim 21, wherein prior to the step of forming the protective layer on the electronic device, the method further comprising:

a step of forming said supporting layer on said first substrate and said residual portion of the sacrifice layer, said supporting layer covering said residual portion of the sacrifice layer.

23. The method according to claim 22, wherein prior to the step of forming said supporting layer on the first substrate, the method further comprising:

a step of removing portions of the sacrifice layer to expose said first substrate, wherein said residual portion of the sacrifice layer remains after the step of removing portions of the sacrifice layer.

* * * * *